(12) United States Patent
Jeon et al.

(10) Patent No.: US 12,159,013 B2
(45) Date of Patent: Dec. 3, 2024

(54) TOUCH SENSOR AND DISPLAY DEVICE INCLUDING THE SAME

(71) Applicant: Samsung Display Co., Ltd., Yongin-Si (KR)

(72) Inventors: Hyun Jee Jeon, Yongin-si (KR); Sang Hyun Lim, Yongin-si (KR)

(73) Assignee: Samsung Display Co., Ltd., Yongin-Si (KR)

(*) Notice: Subject to any disclaimer, the term of this patent is extended or adjusted under 35 U.S.C. 154(b) by 15 days.

(21) Appl. No.: 18/099,268

(22) Filed: Jan. 20, 2023

(65) Prior Publication Data

US 2023/0315239 A1    Oct. 5, 2023

(30) Foreign Application Priority Data

Apr. 1, 2022    (KR) .................. 10-2022-0041206

(51) Int. Cl.
| | |
|---|---|
| *G06F 3/044* | (2006.01) |
| *G06F 3/041* | (2006.01) |
| *H10K 59/40* | (2023.01) |
| *H10K 59/80* | (2023.01) |
| *G09G 3/3233* | (2016.01) |

(52) U.S. Cl.
CPC .......... *G06F 3/0446* (2019.05); *G06F 3/0412* (2013.01); *G06F 3/04164* (2019.05);
(Continued)

(58) Field of Classification Search
CPC .. G06F 3/0446; G06F 3/0412; G06F 3/04164; G06F 3/0445; G06F 3/0448; G06F 2203/04111; H10K 59/10; H10K 59/8791; G09G 3/3233; G09G 2300/0426; G09G 2300/0819; G09G 2300/0842; G09G 2300/0861; G09G 2354/00;
(Continued)

(56) References Cited

U.S. PATENT DOCUMENTS

| | | |
|---|---|---|
| 10,127,857 B2 | 11/2018 | Lee et al. |
| 10,514,800 B2 | 12/2019 | Jo et al. |

(Continued)

FOREIGN PATENT DOCUMENTS

| | | |
|---|---|---|
| KR | 10-2013-0057637 A | 6/2013 |
| KR | 10-2017-0056798 A | 5/2017 |

(Continued)

*Primary Examiner* — Christopher E Leiby
(74) *Attorney, Agent, or Firm* — Innovation Counsel LLP

(57) ABSTRACT

A touch sensor includes first sensor patterns, second sensor patterns, a conductive line, and a temperature sensing electrode set. The first sensor patterns are electrically connected in a first direction. The second sensor patterns are electrically insulated from first sensor patterns and are electrically connected in a second direction different from the first direction. The conductive line is electrically connected to at least one of the first sensor patterns or at least one of the second sensor patterns. The temperature sensing electrode set is positioned between two of the first sensor patterns, is positioned between two of the second sensor patterns, or is positioned between the conductive line and at least one of the first sensor patterns and the second sensor patterns. The temperature sensing electrode set includes a first electrode and a second electrode spaced from each other.

19 Claims, 18 Drawing Sheets

(52) U.S. Cl.
CPC ........... *G06F 3/0445* (2019.05); *H10K 59/40* (2023.02); *H10K 59/8791* (2023.02); *G06F 2203/04111* (2013.01); *G09G 3/3233* (2013.01); *G09G 2300/0426* (2013.01); *G09G 2300/0819* (2013.01); *G09G 2300/0842* (2013.01); *G09G 2300/0861* (2013.01); *G09G 2354/00* (2013.01)

(58) Field of Classification Search
CPC ..... G09G 2310/0251; G09G 2320/041; G09G 2203/04103
See application file for complete search history.

(56) References Cited

U.S. PATENT DOCUMENTS

| | | |
|---|---|---|
| 10,908,754 B2 | 2/2021 | Bang et al. |
| 2013/0135247 A1 | 5/2013 | Na et al. |
| 2020/0142539 A1* | 5/2020 | Kim ..................... H10K 59/40 |
| 2020/0233516 A1* | 7/2020 | Hwang ................ G06F 3/0443 |
| 2020/0285339 A1* | 9/2020 | Kim ..................... G06F 3/0412 |
| 2021/0004124 A1 | 1/2021 | Park |
| 2021/0019020 A1 | 1/2021 | Hyung et al. |
| 2021/0263630 A1* | 8/2021 | Kim .................... G06F 3/04142 |
| 2022/0236832 A1* | 7/2022 | Watazu ................ G06F 3/0446 |
| 2022/0365629 A1* | 11/2022 | Ga Young ............. G06F 3/0443 |
| 2023/0305665 A1* | 9/2023 | Jeon ..................... G06F 3/0416 |

FOREIGN PATENT DOCUMENTS

| | | |
|---|---|---|
| KR | 10-2017-0087559 A | 7/2017 |
| KR | 10-2018-0059074 A | 6/2018 |
| KR | 10-2020-0033362 A | 3/2020 |
| KR | 10-2021-0005437 A | 1/2021 |
| KR | 10-2021-0010714 A | 1/2021 |

* cited by examiner

TOUCH SENSOR AND DISPLAY DEVICE INCLUDING THE SAME

CROSS-REFERENCE TO RELATED APPLICATION

This application claims priority to Korean Patent Application No. 10-2022-0041206 filed on Apr. 1, 2022; the Korean Patent Application is incorporated by reference.

BACKGROUND

1. Field

The technical field relates to a touch sensor and a display device including the touch sensor.

2. Description of the Related Art

A display device may display images in response to input signals. The display device may include a touch sensor for sensing a touch of an external object on the display device. For example, the external object may be a finger of a user of the display device.

SUMMARY

An embodiment may be related to a touch sensor capable of sensing not only a touch of a user but also a temperature change of a surrounding environment. An embodiment may be related to a display device including the touch sensor.

According to an embodiment, a touch sensor may include a base layer including a sensing area and a non-sensing area, a touch electrode positioned in the sensing area, and including first sensor patterns extending in a first direction and second sensor patterns disposed to be spaced apart from the first sensor patterns and extending in a second direction crossing the first direction, and a temperature sensing electrode positioned in the sensing area and disposed to be spaced apart from the touch electrode. The temperature sensing electrode may include a first electrode and a second electrode disposed to be spaced apart from each other.

Each of the second sensor patterns may include a first sub-pattern and a second sub-pattern spaced apart from each other in the first direction. The first sub-pattern may be electrically connected to a first sub-pattern adjacent in the second direction through a first connection pattern to form a first sensing column. The second sub-pattern may be electrically connected to a second sub-pattern adjacent in the second direction through a second connection pattern to form a second sensing column. The first connection pattern may be integrally formed with two first sub-patterns adjacent in the second direction. The second connection pattern may be integrally formed with two second sub-patterns adjacent in the second direction.

The temperature sensing electrode may be positioned between the first sensing column and the second sensing column.

The second electrode may be positioned between the first sensing column and the second sensing column and may include a first sub-electrode and a second sub-electrode spaced apart in the first direction with the first electrode interposed therebetween. The first electrode, the first sub-electrode, and the second sub-electrode may extend along the second direction between the first sensing column and the second sensing column.

A distance between the first electrode and the second electrode may be less than a distance between each of the first sensor patterns and each of the second sensor patterns.

The touch electrode may further include a bridge pattern electrically connecting the first sensor patterns. The first sub-electrode and the second sub-electrode may be electrically connected to the first sensor patterns through the bridge pattern.

The touch sensor may further include a first conductive layer disposed in the sensing area on the base layer, a first insulating layer provided on the first conductive layer, a second conductive layer provided on the first insulating layer, and a second insulating layer provided on the second conductive layer.

The first conductive layer may include the first sensor patterns, the second sensor patterns, the first connection pattern, the second connection pattern, the first electrode, and the second electrode. The second conductive layer may include the bridge pattern.

The first conductive layer may include the bridge pattern. The second conductive layer may include the first sensor patterns, the second sensor patterns, the first connection pattern, the second connection pattern, the first electrode, and the second electrode.

Each of the first sensor patterns, each of the second sensor patterns, the first electrode, and the second electrode may have a mesh shape.

The touch sensor may further include a touch pad disposed in the non-sensing area of the base layer, first sensing lines disposed in the non-sensing area of the base layer and electrically connected to the touch pad and the first sensor patterns, second sensing lines disposed in the non-sensing area of the base layer and electrically connected to the touch pad and the second sensor patterns, and third sensing lines disposed in the non-sensing area of the base layer and electrically connected to the touch pad and the first electrode.

The touch sensor may further include a touch pad disposed in the non-sensing area of the base layer, first sensing lines disposed in the non-sensing area of the base layer and electrically connected to the touch pad and the first sensor patterns, second sensing lines disposed in the non-sensing area of the base layer and electrically connected to the touch pad and the second sensor patterns, and a resistor positioned between each of the second sensing lines and the first electrode.

Each of the first sensor patterns may include a first sub-pattern and a second sub-pattern spaced apart from each other in the second direction. The first sub-pattern may be electrically connected to a first sub-pattern adjacent in the first direction through a first connection pattern to form a first sensing row. The second sub-pattern may be electrically connected to a second sub-pattern adjacent in the first direction through a second connection pattern to form a second sensing row. The first connection pattern may be integrally formed with two first sub-patterns adjacent in the first direction. The second connection pattern may be integrally formed with two second sub-patterns adjacent in the first direction.

The temperature sensing electrode may be positioned between the first sensing row and the second sensing row.

The second electrode may be positioned between the first sensing row and the second sensing row and may include a first sub-electrode and a second sub-electrode spaced apart in the second direction with the first electrode interposed therebetween. The first electrode, the first sub-electrode, and the second sub-electrode may extend along the first direction between the first sensing row and the second sensing row.

A distance between the first electrode and the second electrode may be less than a distance between each of the first sensor patterns and each of the second sensor patterns.

The first sensor patterns may be electrically connected to each other through a connection pattern to form a sensing row. The second sensor patterns may be electrically connected to each other through a first bridge pattern to form a sensing column. The temperature sensing electrode may be disposed adjacent to the sensing column in one area of the sensing area.

The touch sensor may further include a touch pad disposed in the non-sensing area of the base layer, first sensing lines disposed in the non-sensing area of the base layer and electrically connected to the touch pad and the first sensor patterns, second sensing lines disposed in the non-sensing area of the base layer and electrically connected to the touch pad and the second sensor patterns, and third sensing lines disposed in the non-sensing area of the base layer and electrically connected to the touch pad and the first electrode.

The touch sensor may further include a touch pad disposed in the non-sensing area of the base layer, first sensing lines disposed in the non-sensing area of the base layer and electrically connected to the touch pad and the first sensor patterns, second sensing lines disposed in the non-sensing area of the base layer and electrically connected to the touch pad and the second sensor patterns, and a resistor positioned between at least one of the second sensing lines and the first electrode.

According to an embodiment, a display device may include a display panel displaying an image, a touch sensor disposed on the display panel, a polarizing film disposed on the touch sensor and coupled to the touch sensor through a first adhesive layer, and a window disposed on the polarizing film and coupled to the polarizing film through a second adhesive layer.

The touch sensor may include a base layer including a sensing area and a non-sensing area, a touch electrode positioned in the sensing area, and including first sensor patterns extending in a first direction and second sensor patterns disposed to be spaced apart from the first sensor patterns and extending in a second direction crossing the first direction, and a temperature sensing electrode positioned in the sensing area and disposed to be spaced apart from the touch electrode. The temperature sensing electrode may include a first electrode and a second electrode extending in an extension direction of at least one of the first and second sensor patterns and disposed to be spaced apart from each other.

An embodiment may be related to a touch sensor. The touch sensor may include first sensor patterns, second sensor patterns, a conductive line, and a temperature sensing electrode set. The first sensor patterns may be electrically connected in a first direction. The second sensor patterns may be electrically insulated from first sensor patterns and may be electrically connected in a second direction different from the first direction. The conductive line may be electrically connected to at least one of the first sensor patterns or at least one of the second sensor patterns. The temperature sensing electrode set may be positioned between two of the first sensor patterns, may be positioned between two of the second sensor patterns, or may be positioned between the conductive line and at least one of the first sensor patterns and the second sensor patterns. The temperature sensing electrode set may include a first electrode and a second electrode spaced from each other.

The touch sensor may include the following elements: a first connection pattern extending in the second direction; and a second connection pattern extending in the second direction. The second sensor patterns may include a first sub-pattern and a second sub-pattern spaced from each other in the first direction and may include a third sub-pattern and a fourth sub-pattern spaced from each other in the first direction. The first sub-pattern may be electrically connected to the third sub-pattern through the first connection pattern. The second sub-pattern may be electrically connected to the fourth sub-pattern through the second connection pattern.

The temperature sensing electrode may be positioned between the first sub-pattern and the second sub-pattern.

The second electrode may be positioned between the first sub-pattern and the first electrode. The temperature sensing electrode set may include a third electrode positioned between the first electrode and the second sub-pattern. Each of the first electrode, the second electrode, and the third electrode may extend in the second direction between the first sub-pattern and the second sub-pattern.

A distance between the first electrode and the second electrode may be less than a distance between two immediately neighboring ones of the first sensor patterns and may be less than a distance between two immediately neighboring ones of the second sensor patterns.

The touch sensor may include a bridge pattern electrically connecting the two of the first sensor patterns. The second electrode and the third electrode may be electrically connected to the two of the first sensor patterns through the bridge pattern.

The touch sensor may include the following elements: a base layer; a first insulating layer overlapping the base layer and positioned between the first electrode and the bridge pattern; and a second insulating layer overlapping the first insulating layer. At least one of the first electrode and the bridge pattern may be positioned between the first insulating layer and the second insulating layer.

The first sensor patterns, the second sensor patterns, the first connection pattern, the second connection pattern, the first electrode, and the second electrode may be positioned between the base layer and the first insulating layer.

The first sensor patterns, the second sensor patterns, the first connection pattern, the second connection pattern, the first electrode, and the second electrode may be positioned between the first insulating layer and the second insulating layer.

Each of the first sensor patterns, each of the second sensor patterns, the first electrode, and the second electrode may each have a mesh structure.

The touch sensor may include the following elements: a touch pad; first sensing lines electrically connecting the touch pad to the first sensor patterns; second sensing lines electrically connecting the touch pad to the second sensor patterns; and a third sensing lines electrically connecting the touch pad to the first electrode. The conductive line may be one of the first sensing lines or one of the second sensing lines.

The touch sensor may include the following elements: a touch pad electrically connected through the conductive line to some of the second sensor patterns; first sensing lines electrically connecting the touch pad to the first sensor patterns; and a resistor electrically connected between the conductive line and the first electrode.

The touch sensor may include the following elements: a first connection pattern extending in the first direction; and a second connection pattern extending in the first direction. The first sensor patterns may include a first sub-pattern and a second sub-pattern spaced from each other in the second direction and may include a third sub-pattern and a fourth sub-pattern spaced from each other in the second direction. The first sub-pattern may be electrically connected to the third sub-pattern through the first connection pattern. The second sub-pattern may be electrically connected to the fourth sub-pattern through the second connection pattern.

The temperature sensing electrode may be positioned between the first sub-pattern and the second sub-pattern.

The second electrode may be positioned between the first sub-pattern and the first electrode. The temperature sensing electrode set may include a third electrode positioned between the first electrode and the second sub-pattern. Each of the first electrode, the second electrode, and the third electrode may extend in the first direction between the first sub-pattern and the second sub-pattern.

A distance between the first electrode and the second electrode may be less than a distance between two immediately neighboring ones of the first sensor patterns and may be less than a distance between two immediately neighboring ones of the second sensor patterns.

The conductive line may extend in the second direction. The temperature sensing electrode set may be disposed between the conductive line and the second sensor patterns.

The touch sensor according may include the following: a touch pad; first sensing lines disposed electrically connecting the touch pad to the first sensor patterns; second sensing lines including the conductive line and electrically connecting the touch pad to the second sensor patterns; and a third sensing line electrically connecting the touch pad to the first electrode.

The touch sensor may include the following elements: a touch pad electrically connected through the conductive line to some of the second sensor patterns; and a resistor electrically connected between the conductive line and the first electrode.

An embodiment may be related to a display device. The display device may include a display panel, a touch sensor, a polarizing film, and a window. The display panel may display an image. The touch sensor may include one or more of the above-described features and may be disposed on the display panel. The polarizing film may be disposed on the touch sensor and may be coupled to the touch sensor through a first adhesive layer. The window may be disposed on the polarizing film and may be coupled to the polarizing film through a second adhesive layer.

DETAILED DESCRIPTION

Figure 1:
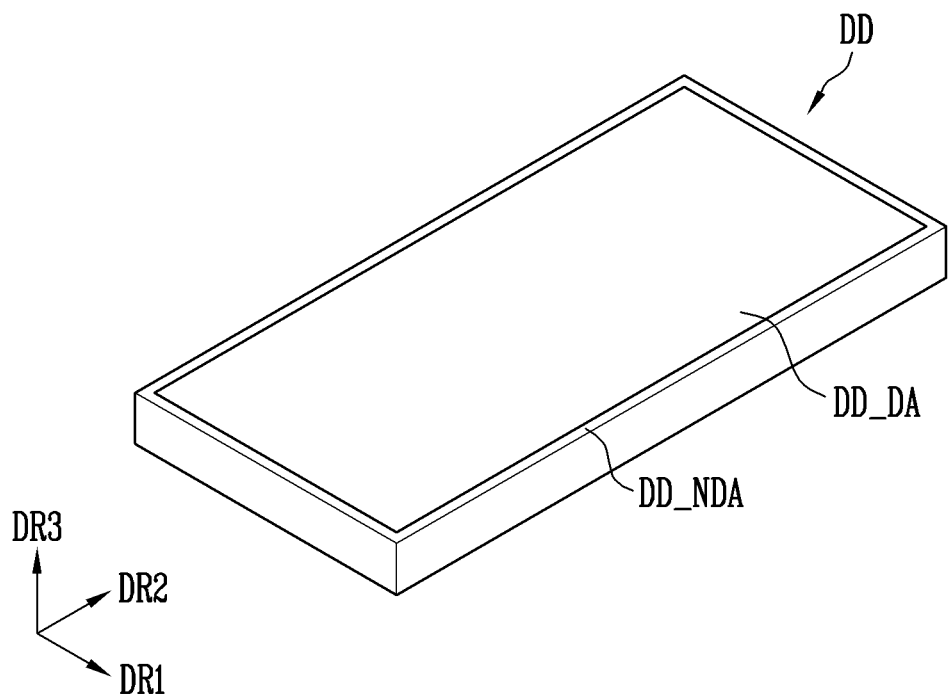
FIG. 1 is a schematic perspective view of a display device according to an embodiment.

Examples of embodiments are described with reference to the drawings. Practical embodiments are not limited to the described examples. Practical embodiments include all modifications, equivalents, and substitutions within the scope of the present disclosure.

Similar reference numerals may be used for similar components in the drawings. In the drawings, dimensions of structures may be exaggerated for clarity.

Terms "first," "second," and the like may be used to describe various elements, but the elements should not be limited by the terms. The terms may be used for distinguishing one element from another element. A first component may be referred to as a second component. A second component may be referred to as a first component. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The term "comprise," "include," "have", or the like may specify the presence of the stated items, but may not exclude the presence or addition of one or more other items.

The term "on" may mean "directly on" or "indirectly on." The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be made of." The term "adjacent" or "neighboring" may mean "immediately adjacent" or "immediately neighboring." The expression that an element extends in a particular direction may mean that the element extends lengthwise in the particular direction and/or that the lengthwise direction of the element is in the particular direction. The noun "pattern" may mean "member." The term "defined" may mean "formed" or "provided." The expression that a space or opening overlaps an object may mean that (the position of) the space or opening overlaps with (the position of) the object. The term "overlap" may be equivalent to "be overlapped by." The expression that a first element overlaps with a second element in a plan view may mean that the first element overlaps the second element in direction perpendicular to a substrate. The term "electrode" may mean "electrode set." The term "line" may mean "line set." The term "pattern/member" may mean "pattern/member set." The term "capacitance" may mean "capacitance set." The preposition "in" may mean "in" and/or "on."

A singular expression may also mean a plural expression unless the context clearly indicates otherwise.

Figure 2:
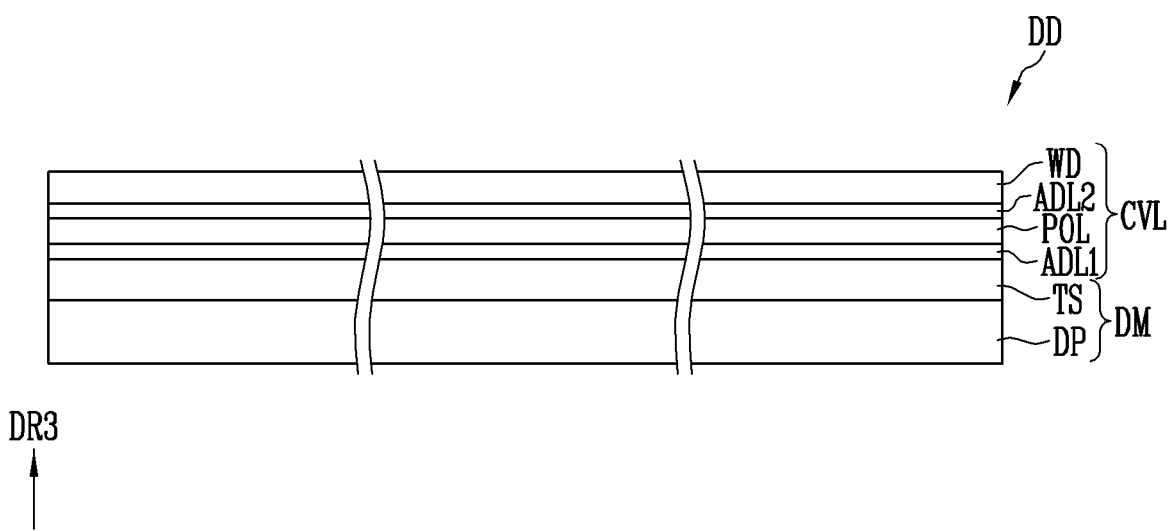
FIG. 2 is a schematic cross-sectional view of the display device of FIG. 1 according to an embodiment.

FIG. 1 is a schematic perspective view of a display device DD according to an embodiment. FIG. 2 is a schematic cross-sectional view of the display device DD of FIG. 1 according to an embodiment.

Referring to FIGS. 1 and 2, the display device DD may include a display module DM and a cover layer CVL.

The display device DD may have one or more of various shapes. For example, the display device DD may have a rectangular plate shape having two pairs of parallel sides. In the display device DD, one pair of sides may be longer than the other pair of sides. An extension direction of the long sides is indicated as a second direction DR2, an extension direction of the short sides is indicated as a first direction DR1, and a thickness direction of the display device DD is indicated as a third direction DR3. The display device DD may have rounded corners.

At least a portion of the display device DD may have flexibility, and the display device DD may be folded at a portion having flexibility.

The display device DD may include a display area DD_DA for displaying an image and a non-display area DD_NDA provided on at least one side of the display area DD_DA. The non-display area DD_NDA does not display any image in response to input signals.

The display device DD may include a sensing area and a non-sensing area. The display device DD may not only display an image through the sensing area, but also sense a touch input performed on a display surface (or an input surface) and/or sense light incident from a front direction. The non-sensing area may surround the sensing area. A partial area of the display area DD_DA may correspond to the sensing area. A shape, a size, a position, and the like of the sensing area may be configured according to a touch electrode.

The display module DM may include a display panel DP and a touch sensor TS.

The touch sensor TS may be disposed directly on the display panel DP or may be coupled to the display panel DP through an adhesive layer or a substrate.

The display panel DP may display an image. The display panel DP may be a display panel capable of self-emission, such as an organic light emitting display panel (OLED panel). The display panel DP may be a non-emission display panel, such as a liquid crystal display panel (LCD panel), an electro-phoretic display panel (EPD panel), or an electro-wetting display panel (EWD panel); the display device DD may include a backlight unit that supplies light to the display panel DP.

The touch sensor TS may be disposed on an image display surface of the display panel DP and may receive a touch input of a user. The touch sensor TS may recognize a touch event of the display device DD through a user's hand or a separate input means. The touch sensor TS may recognize the touch event using a capacitive method.

The touch sensor TS may sense the touch input using a mutual capacitance method or may sense the touch input in a self-capacitance method.

The cover layer CVL may be disposed on the display module DM.

The cover layer CVL may include a polarizing film POL, first and second adhesive layers ADL1 and ADL2, and a window WD.

The polarizing film POL may be provided between the touch sensor TS and the window WD, and may polarize light emitted from the display panel DP along a polarization axis. The polarizing film POL may be coupled to the display module DM (or the touch sensor TS) through the first adhesive layer ADL1.

The first adhesive layer ADL1 may include a pressure sensitive adhesive that may perform adhesion when receiving a pressure. The first adhesive layer ADL1 may be attached to the adhesive surface by pressure without a heat treatment or a UV treatment at room temperature.

The window WD for protecting an exposed surface of the display module DM may be provided on the polarizing film POL. The window WD may protect the underlying components (for example, the display module DM) from external impact, and may provide the input surface and/or the display surface to the user. The window WD may be coupled to the display module DM using the second adhesive layer ADL2. The second adhesive layer ADL2 may include an optically clear adhesive.

The window WD may have a multilayer structure including a glass substrate, a plastic film, and a plastic substrate. The multilayer structure may be formed through a continuous process or an adhesion process using an adhesive layer. The whole or a portion of the window WD may have flexibility.

Figure 3:
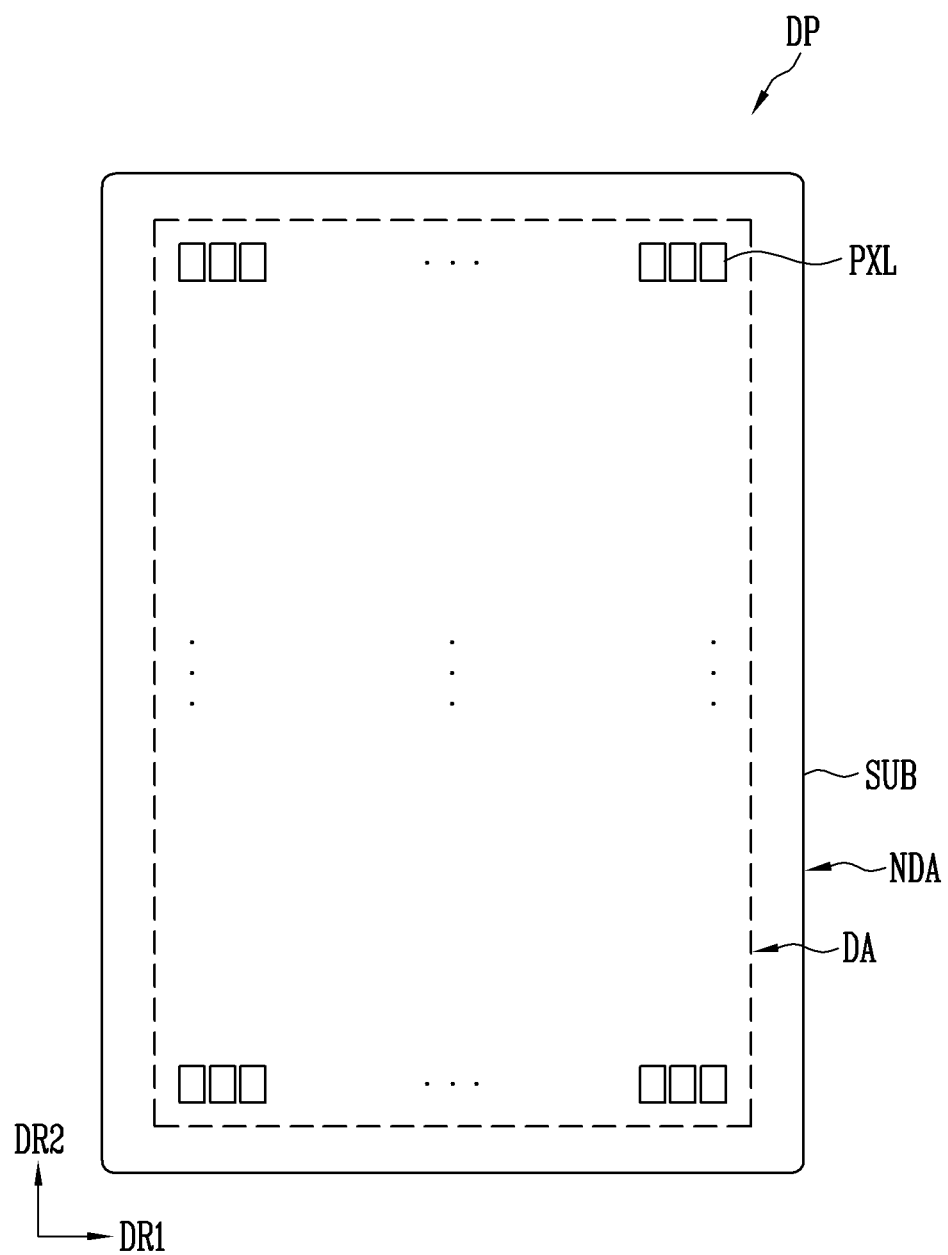
FIG. 3 is a schematic plan view of a display panel of FIG. 2 according to an embodiment.
Figure 4:
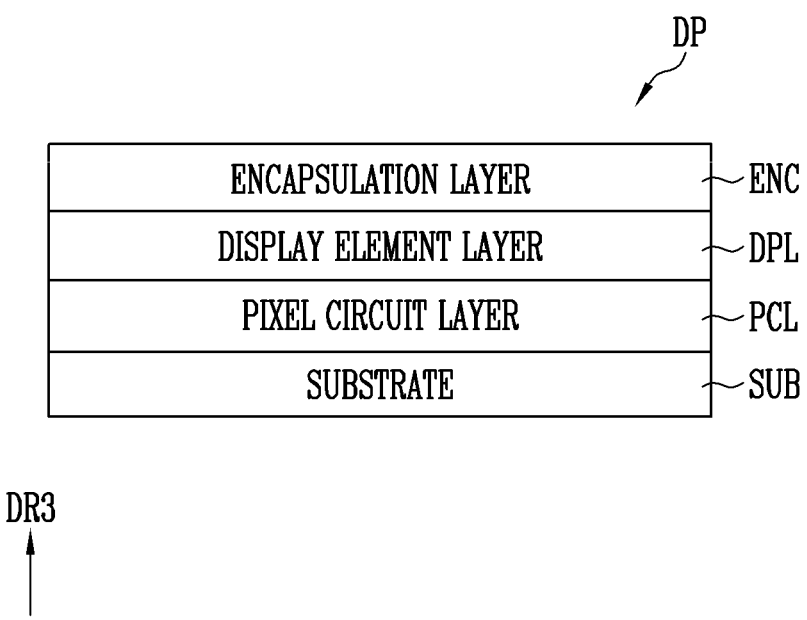
FIG. 4 is a schematic cross-sectional view of the display panel of FIG. 2 according to an embodiment.

FIG. 3 is a schematic plan view of the display panel DP of FIG. 2 according to an embodiment. FIG. 4 is a schematic cross-sectional view of the display panel DP of FIG. 2 according to an embodiment.

Referring to FIGS. 1 to 4, the display panel DP may include a substrate SUB and pixels PXL provided on the substrate SUB.

The substrate SUB may include one area having a substantially rectangular shape. The number of areas provided on the substrate SUB may be different for different embodiments, and the shape of the substrate SUB may correspond to the area(s) provided on the substrate SUB.

The substrate SUB may be formed of an insulating material such as glass or resin. In addition, the substrate SUB may be formed of a material having flexibility to be bent or folded, and may have a single layer structure or a multilayer structure. For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The substrate SUB may include a display area DA and a non-display area NDA. The display area DA may accommodate/support the pixels PXL to display an image. The non-display area NDA may accommodate/support no pixels PXL and may display no image.

The display area DA of the display panel DP may correspond to the display area DD_DA of the display device DD, and the non-display area NDA of the display panel DP may correspond to the non-display area DD_NDA of the display device DD.

A driver for driving the pixels PXL and a portion of a line unit (for example, fan-out lines) connecting the pixels PXL and the driver may be provided in/on the non-display area NDA. The non-display area NDA may correspond to a bezel area of the display device DD.

The pixels PXL may be provided in/on the display area DA of the substrate SUB. Each of the pixels PXL may be a minimum unit for displaying an image. The pixels PXL may include a light emitting element emitting white light and/or color light. Each of the pixels PXL may emit red, green, or blue light, and/or may emit cyan, magenta, or yellow light.

The pixels PXL may be arranged in a matrix form in rows (or pixel rows) extending in the first direction DR1 and columns (or pixel columns) extending in the second direction DR2 different from the first direction DR1. The pixel PXL may be arranged in other forms. The pixels PXL may each have a rectangular shape in the drawing may have one or more of other shapes. The pixels PXL may have different areas (or sizes) and/or shapes. For example, pixels PXL for emitting light of different colors may have different areas (or sizes) and/or different shapes.

The driver may control the pixels PXL by providing signals and power to the pixels PXL through the line unit.

As shown in FIG. 4, the display panel DP may include a pixel circuit layer PCL, a display element layer DPL, and an encapsulation layer ENC sequentially disposed on the substrate SUB.

The pixel circuit layer PCL may be provided on the substrate SUB and may include transistors and signal lines connected to the transistors. Each transistor may include a semiconductor layer, a gate electrode, a first terminal, and a second terminal; at least some of the elements are insulated from each other by at least an insulating layer. The semiconductor layer may include amorphous silicon, poly silicon, low temperature poly silicon, an organic semiconductor, and/or an oxide semiconductor. The gate electrode, the first terminal, and the second terminal may include at least one of aluminum (Al), copper (Cu), titanium (Ti), and molybdenum (Mo). The pixel circuit layer PCL may include one or more insulating layers.

The display element layer DPL may be disposed on the pixel circuit layer PCL. The display element layer DPL may include a light emitting element. The light emitting element may be, for example, an organic light emitting diode. The light emitting element may be an inorganic light emitting element including an inorganic light emitting material or a light emitting element that emits light by changing a wavelength of light emitted using a quantum dot.

The encapsulation layer ENC may be disposed on the display element layer DPL. The encapsulation layer ENC may be an encapsulation substrate or a multilayer encapsulation film. The encapsulation layer ENC may include an inorganic layer and/or an organic layer. For example, the encapsulation layer ENC may include an inorganic layer, an organic layer, and an inorganic layer that are sequentially stacked. The encapsulation layer ENC may prevent external air and moisture from passing through into the display element layer DPL and the pixel circuit layer PCL.

Figure 5:
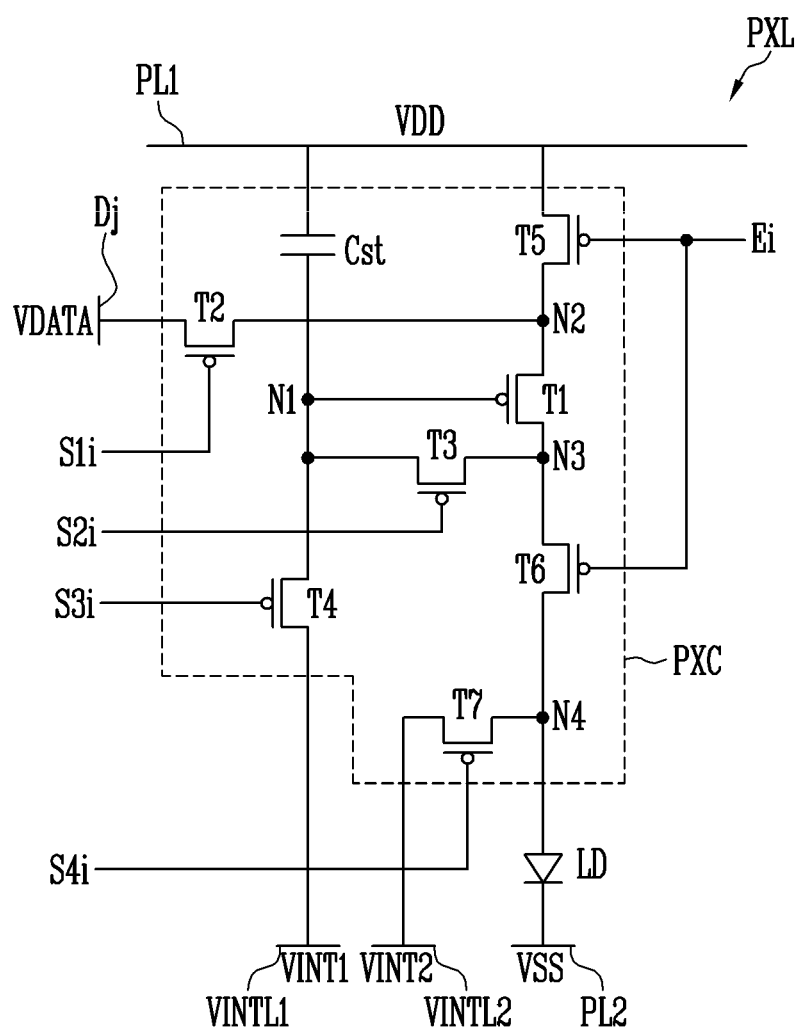
FIG. 5 is a schematic circuit diagram illustrating electrical connections between components included in a pixel shown in FIG. 3 according to an embodiment.

FIG. 5 is a schematic circuit diagram illustrating electrical connections between components included in a pixel PXL shown in FIG. 3 according to an embodiment.

In FIG. 5, a pixel PXL positioned in an i-th pixel row and connected to a j-th data line Dj is shown as an example (where i and j are natural numbers).

Referring to FIGS. 1 to 5, the pixel PXL may include the light emitting element LD and a pixel circuit PXC for driving the light emitting element LD.

A first electrode of the light emitting element LD may be connected to a fourth node N4, and a second electrode of the light emitting element LD may be connected to a second power line PL2 (or a second driving voltage line) transmitting a second driving voltage VSS. The light emitting element LD may generate (or emit) light (or rays) of a corresponding luminance in response to a current amount (or a driving current) supplied from a first transistor T1.

The light emitting element LD may be an organic light emitting diode including an organic light emitting layer. The light emitting element LD may be an inorganic light emitting element formed of an inorganic material, or a light emitting element configured of an inorganic material and an organic material in combination. The light emitting element LD may include inorganic light emitting elements connected in parallel and/or in series between the second power line PL2 and the fourth node N4.

The pixel circuit PXC may include first to seventh transistors T1 to T7 and a storage capacitor Cst.

A gate electrode of the first transistor T1 (or a driving transistor) may be electrically connected to a first node N1, a first electrode (or a first terminal) of the first transistor T1 may be electrically connected to a second node N2, and a second electrode (or a second terminal) of the first transistor T1 may be electrically connected to a third node N3. The first transistor T1 may control the current amount flowing from a first driving voltage VDD to the second driving voltage VSS via the light emitting element LD in response to a voltage of the first node N1. The first driving voltage VDD may be higher than the second driving voltage VSS.

The second transistor T2 (or a switching transistor) may be electrically connected between the second node N2 and the j-th data line Dj (hereinafter referred to as a 'data line'). A gate electrode of the second transistor T2 may be connected to a first scan line S1i. The second transistor T2 may be turned on when a scan signal is supplied to the first scan line S1i to electrically connect the data line Dj and the second node N2.

The third transistor T3 (or a compensation transistor) may be electrically connected between the second electrode (or the third node N3) and the gate electrode (or the first node N1) of the first transistor T1. A gate electrode of the third transistor T3 may be electrically connected to a second scan line S2i. The third transistor T3 may be turned on when a scan signal is supplied to the second scan line S2i to electrically connect the second electrode and the gate electrode of the first transistor T1 (or the first node N1 and the third node N3). A timing at which the second electrode (for example, the drain electrode) of the first transistor T1 and the gate electrode of the first transistor T1 are connected may be controlled by the scan signal. When the third transistor T3 is turned on, the first transistor T1 may be connected in a diode form.

The fourth transistor T4 (or a first initialization transistor) may be electrically connected between the first node N1 (or the gate electrode of the first transistor T1) and a first initialization voltage line VINTL1. A gate electrode of the fourth transistor T4 may be connected to a third scan line S3i. The fourth transistor T4 may be turned on in response to a scan signal supplied to the third scan line S3i to supply a first initialization voltage VINT1 to the first node N1. The first initialization voltage VINT1 may be lower than a data voltage VDATA supplied to the data line Dj. Accordingly, a gate voltage (or the first node N1) of the first transistor T1 may be initialized to the first initialization voltage VINT1 by the turn-on of the fourth transistor T4.

The fifth transistor T5 (or a second emission control transistor) may be electrically connected between the first power line PL1 (or the first driving voltage line) and the second node N2. A gate electrode of the fifth transistor T5 may be electrically connected to an i-th emission control line Ei (hereinafter, referred to as an emission control line). The fifth transistor T5 is turned on when the emission control signal is supplied to the emission control line Ei.

The sixth transistor T6 (or a first emission control transistor) may be electrically connected between the second electrode (that is, the third node N3) of the first transistor T1 and the fourth node N4. A gate electrode of the sixth transistor T6 may be electrically connected to the emission control line Ei. The sixth transistor T6 may be controlled to be substantially the same as that of the fifth transistor T5.

The fifth transistor T5 and the sixth transistor T6 may be turned on in response to the emission control signal supplied through the emission control line Ei, and may form a movement path of the driving current between the first power line PL1 and the fourth node N4 (or between the first power line PL1 and the second power line PL2).

In FIG. 5, the fifth transistor T5 and the sixth transistor T6 are electrically connected to the same emission control line Ei. The fifth transistor T5 and the sixth transistor T6 may be electrically connected to separate emission control lines to which different emission control signals are respectively supplied.

The seventh transistor T7 (or a second initialization transistor) may be electrically connected between the fourth node N4 and a second initialization power line VINTL2. A gate electrode of the seventh transistor T7 may be electrically connected to a fourth scan line S4i. The seventh transistor T7 may be turned on when a scan signal is supplied to the fourth scan line S4i to supply a second initialization voltage VINT2 to the fourth node N4. The first initialization power line VINTL1 and the second initialization power line VINTL2 may be (connected to) the same power line.

The storage capacitor Cst may be electrically connected between the first power line PL1 and the first node N1. The storage capacitor Cst may store a difference voltage between the first driving voltage VDD by the first power line PL1 and a voltage obtained by subtracting an absolute threshold voltage of the first transistor T1 from a data voltage applied to the first node N1.

Figure 6:
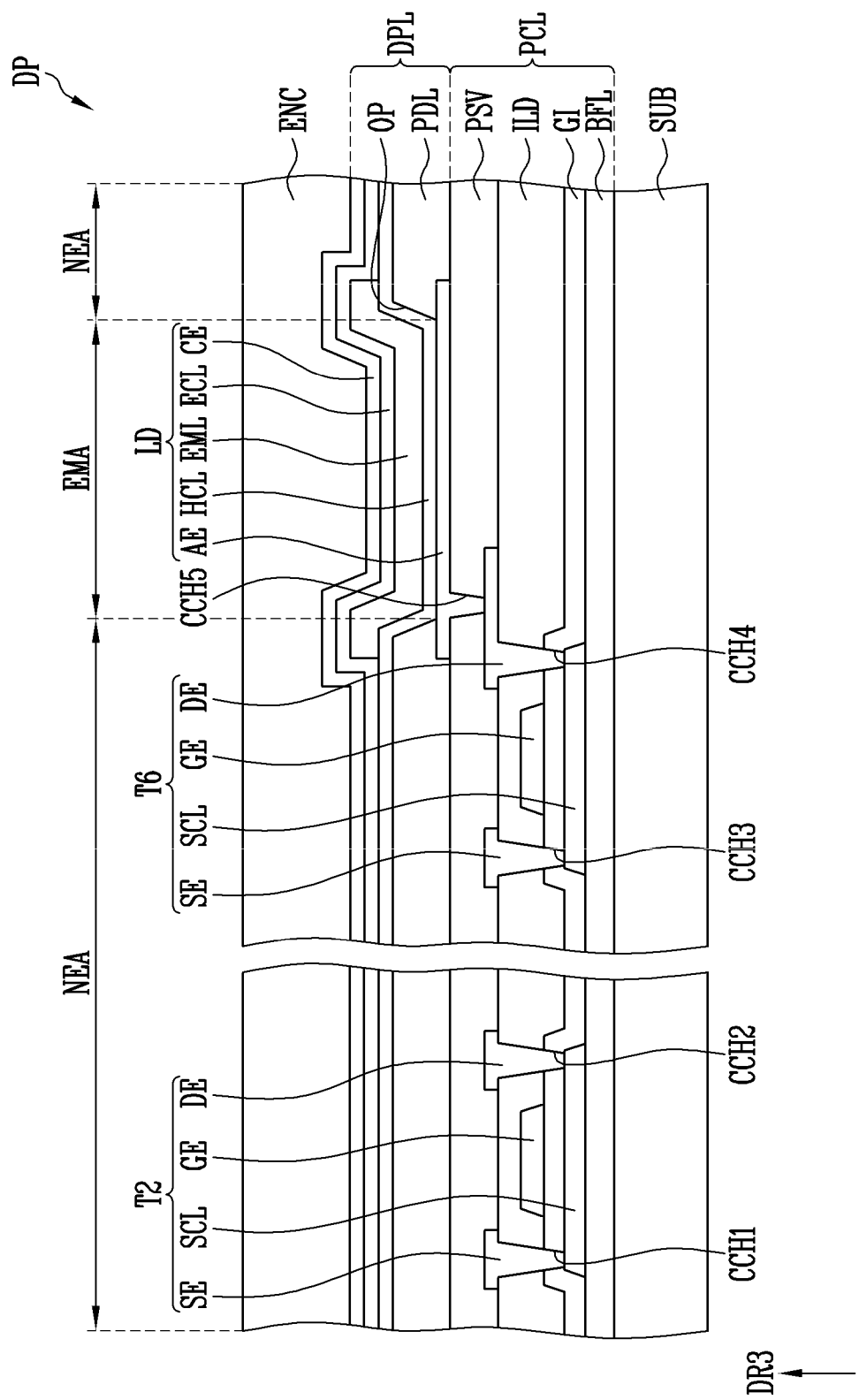
FIG. 6 is a schematic cross-sectional view of a portion of the display panel of FIG. 2 according to an embodiment.

FIG. 6 is a schematic cross-sectional view of a portion of the display panel DP of FIG. 2 according to an embodiment.

In FIG. 6, a cross-section of a portion corresponding to the second and sixth transistors T2 and T6 among the first to seventh transistors T1 to T7 shown in FIG. 5 is shown.

Referring to FIGS. 1 to 6, the display panel DP may include the substrate SUB, the pixel circuit layer PCL, the display element layer DPL, and the encapsulation layer ENC.

The substrate SUB may include an insulating material such as glass, an organic polymer, or quartz. The substrate SUB may be formed of a material having flexibility to be bent or folded, and may have a single layer structure or a multilayer structure.

The pixel circuit layer PCL may include the buffer layer BFL, the gate insulating layer GI, the interlayer insulating layer ILD, and a passivation layer PSV sequentially stacked on the substrate SUB in the third direction DR3.

The buffer layer BFL may cover an entire face of the substrate SUB. The buffer layer BFL may prevent an impurity from diffusing into the second and sixth transistors T2 and T6. The buffer layer BFL may be an inorganic insulating layer including an inorganic material. The buffer layer BFL may include at least one of silicon nitride ($SiN_x$), silicon oxide ($SiO_x$), silicon oxynitride ($SiO_xN_y$), and aluminum oxide ($AlO_x$). The buffer layer BFL may be a single layer or may include multiple layers. The multiple layers may be formed of the same material or different materials. The buffer layer BFL may be optional according to a material and a process condition of the substrate SUB.

The gate insulating layer GI may substantially cover a face of the buffer layer BFL. The gate insulating layer GI may include the same material as the buffer layer BFL and/or may include one or more materials suitable for the buffer layer BFL. For example, the gate insulating layer GI may be an inorganic insulating layer including an inorganic material.

The interlayer insulating layer ILD may be disposed on the gate insulating layer GI. The interlayer insulating layer ILD may include the same material as the gate insulating layer GI, and/or may include one or more materials suitable for the gate insulating layer GI.

The passivation layer PSV may be disposed on the interlayer insulating layer ILD. The passivation layer PSV may be an inorganic insulating layer including an inorganic material or an organic insulating layer including an organic material. The inorganic insulating layer may include, for example, at least one of silicon oxide ($SiO_x$), silicon nitride ($SiN_x$), silicon oxynitride ($SiO_xN_y$), and aluminum oxide ($AlO_x$). The organic insulating layer may include, for example, at least one of acrylic resin (polyacrylates resin), an epoxy resin, a phenolic resin, a polyamides resin, a polyimide resin, an unsaturated polyesters resin, a poly-phenylen ethers resin, a poly-phenylene sulfides resin, and a benzocyclobutene resin.

Each of the second and sixth transistors T2 and T6 may include a semiconductor layer SCL, a gate electrode GE, a source electrode SE, and a drain electrode DE.

The semiconductor layer SCL of each of the second and sixth transistors T2 and T6 may be disposed on the buffer layer BFL. The semiconductor layer SCL may include source and drain areas respectively contacting the source electrode SE and the drain electrode DE. An area between the source area and the drain area may be a channel area.

The semiconductor layer SCL may be a semiconductor pattern formed of polysilicon, amorphous silicon, an oxide semiconductor, or the like. The channel area may be an intrinsic semiconductor pattern that is not doped with an impurity. An impurity such as an n-type impurity, a p-type impurity, and other metals may be used as the impurity. The source and drain areas may be semiconductor patterns doped with an impurity.

The gate electrode GE of each of the second and sixth transistors T2 and T6 may be positioned on the gate insulating layer GI and may overlap a corresponding semiconductor layer SCL.

The source electrode SE of each of the second and sixth transistors T2 and T6 may be positioned on the interlayer insulating layer ILD and may contact the source area of the corresponding semiconductor layer SCL through a contact hole passing through the interlayer insulating layer ILD and the gate insulating layer GI. For example, the source electrode SE of the second transistor T2 may contact the source area of the corresponding semiconductor layer SCL through a first contact hole CCH1 passing through the interlayer insulating layer ILD and the gate insulating layer GI, and the source electrode SE of the sixth transistor T6 may contact the source area of the corresponding semiconductor layer SCL through a third contact hole CCH3 passing through the interlayer insulating layer ILD and the gate insulating layer GI.

The drain electrode DE of each of the second and sixth transistors T2 and T6 may be positioned on the interlayer insulating layer ILD and may contact the drain area of the corresponding semiconductor layer SCL through a contact hole passing through the interlayer insulating layer ILD and the gate insulating layer GI. For example, the drain electrode DE of the second transistor T2 may contact the drain area of the corresponding semiconductor layer SCL through a second contact hole CCH2 passing through the interlayer insulating layer ILD and the gate insulating layer GI, and the drain electrode DE of the sixth transistor T6 may contact the drain area of the corresponding semiconductor layer SCL through a fourth contact hole CCH4 passing through the interlayer insulating layer ILD and the gate insulating layer GI.

The passivation layer PSV may substantially cover the second and sixth transistors T2 and T6. The passivation layer PSV may include a fifth contact hole CCH5 exposing a portion of the drain electrode DE of the sixth transistor T6.

The display element layer DPL including the light emitting element LD may be disposed on the passivation layer PSV.

The light emitting element LD may include first and second electrodes AE and CE and an emission layer EML provided between the two electrodes AE and CE. One of the first and second electrodes AE and CE may be an anode, and the other may be a cathode. For example, the first electrode AE may be the anode, and the second electrode CE may be the cathode. When the light emitting element LD is a front surface emission type organic light emitting element, the first electrode AE may be a reflective electrode, and the second electrode CE may be a transmissive electrode. The light emitting element LD may be a front surface emission type organic light emitting element, and the first electrode AE may be an anode.

The first electrode AE may be electrically connected to the drain electrode DE of the sixth transistor T6 through a fifth contact hole CCH5 passing through the passivation layer PSV. The first electrode AE may include a reflective layer (not shown) capable of reflecting light and a transparent conductive layer (not shown) disposed on or under the reflective layer. At least one of the transparent conductive layer and the reflective layer may be electrically connected to the drain electrode DE of the sixth transistor T6.

The display element layer DPL may further include a pixel defining layer PDL having an opening OP exposing a portion of an upper surface of the first electrode AE.

Each pixel PXL provided in the display panel DP may be disposed in a pixel area included in the display area DA. The pixel area may include an emission area EMA and a non-emission area NEA adjacent to the emission area EMA. The non-emission area NEA may surround the emission area EMA. The emission area EMA may correspond to a partial area of the first electrode AE exposed by the opening OP of the pixel defining layer PDL.

The display element layer DPL may include a hole control layer HCL and an electron control layer ECL.

The hole control layer HCL may be disposed in both the emission area EMA and the non-emission area NEA. Although not shown explicitly, the hole control layer HCL and the electron control layer ECL may be commonly formed in some or all of the pixels PXL.

The emission layer EML may be disposed on the hole control layer HCL. The emission layer EML may correspond to the opening OP. A separate emission layer EML may be provided in each of the pixels PXL. The emission layer EML may include an organic material and/or an inorganic material. An emission layer EML may be shared by some or all of the pixels PXL. A color of light generated in the emission layer EML may be one of red, green, blue, and white, or may be one of magenta, cyan, and yellow.

The electron control layer ECL may be provided on the emission layer EML. The electron control layer ECL may be shared by some or all of the pixels PXL, and may inject and/or transport electrons to the emission layer EML.

A second electrode CE may be provided on the electron control layer ECL. The second electrode CE may be shared by some or all of the pixels PXL.

The encapsulation layer ENC covering the second electrode CE may be provided on the second electrode CE.

The encapsulation layer ENC may be a single layer or may include multiple layers. The encapsulation layer ENC may include insulating layers covering the light emitting element LD. The encapsulation layer ENC may include at least one inorganic layer and at least one organic layer. For example, the encapsulation layer ENC may include inorganic layers and organic layers that are alternately stacked. The encapsulation layer ENC may be an encapsulation substrate disposed on the light emitting element LD and bonded to the substrate SUB through a sealant.

Figure 7:
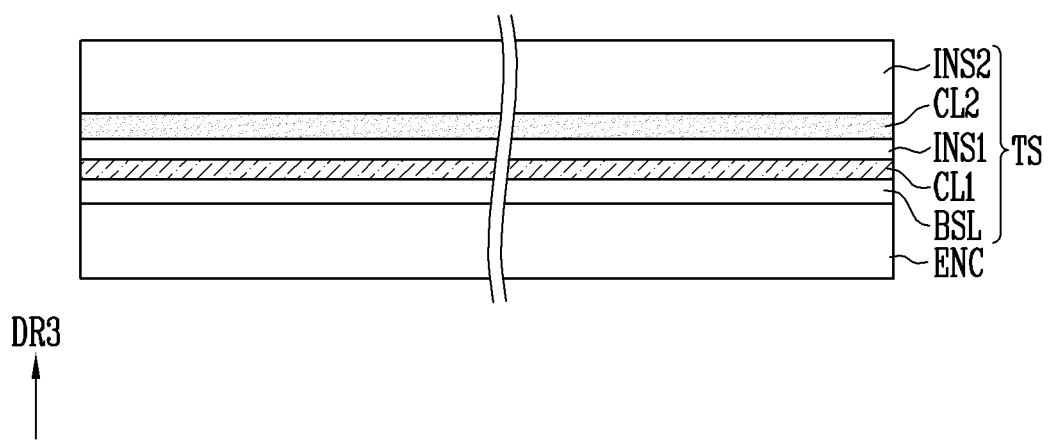
FIG. 7 is a schematic cross-sectional view illustrating a touch sensor of FIG. 2 according to an embodiment.

FIG. 7 is a schematic cross-sectional view illustrating the touch sensor TS of FIG. 2 according to an embodiment.

Referring to FIGS. 1 to 7, the touch sensor TS may include a base layer BSL, a first touch conductive layer CL1 (or a first conductive layer), a first insulating layer INS1, a second touch conductive layer CL2 (or a second conductive layer), and a second insulating layer INS2. The second insulating layer INS2 may be optional.

The first touch conductive layer CL1 may be directly disposed on the encapsulation layer ENC of the display panel DP. Another insulating layer, for example, the base layer BSL, may be disposed between the first touch conductive layer CL1 and the encapsulation layer ENC, and the first touch conductive layer CL1 may be directly disposed on the base layer BSL. The encapsulation layer ENC may include insulating layers, and the base layer BSL may be an uppermost layer of the encapsulation layer ENC.

Each of the first and second touch conductive layers CL1 and CL2 may have a single layer structure or a multilayer structure stacked in a thickness direction (or the third direction DR3). The conductive layer of the single layer structure may include a metal layer or a transparent conductive layer. The metal layer may include at least one of molybdenum, silver, titanium, copper, aluminum, and an alloy of some of the metals. The transparent conductive layer may include a transparent conductive oxide such as indium tin oxide (ITO), indium zinc oxide (IZO), zinc oxide (ZnOx), or indium tin zinc oxide (ITZO). The transparent conductive layer may include PEDOT, a metal nanowire, and graphene. The conductive layer of the multiple layer structure may include metal layers. The metal layers may include an aluminum layer between two titanium layers. The conductive layer of the multiple layer structure may include a metal layer and a transparent conductive layer. The conductive layer of the multiple layer structure may include metal layers and a transparent conductive layer.

Each of the first and second touch conductive layers CL1 and CL2 may include conductive patterns. The first touch conductive layer CL1 may include first conductive patterns, and the second touch conductive layer CL2 may include second conductive patterns. For example, each of the first and second touch conductive layers CL1 and CL2 may include sensor patterns and sensing lines forming touch electrodes.

Each of the first insulating layer INS1 and the second insulating layer INS2 may include an inorganic insulating layer including an inorganic material and/or an organic insulating layer including an organic material.

The inorganic insulating layer may include silicon oxide ($SiO_x$), silicon nitride ($SiN_x$), silicon oxynitride ($SiO_xN_y$), aluminum oxide ($Al_xO_3$), titanium oxide ($TiO_x$), tantalum oxide ($Ta_xO_y$), hafnium oxide ($HfO_x$), and/or zinc oxide ($ZnO_x$). The zinc oxide ($ZnO_x$) may be/include zinc oxide (ZnO), and/or zinc peroxide ($ZnO_2$).

The organic insulating layer may include at least one of an acrylic resin, a methacrylic resin, a polyisoprene, a vinyl-based resin, an epoxy-based resin, a urethane-based resin, a cellulose-based resin, a siloxane-based resin, a polyimide-based resin, a polyamide-based resin, and a perylene-based resin.

A capping layer (not shown) for protecting the second insulating layer INS2 may be provided on the second insulating layer INS2.

Figure 8:
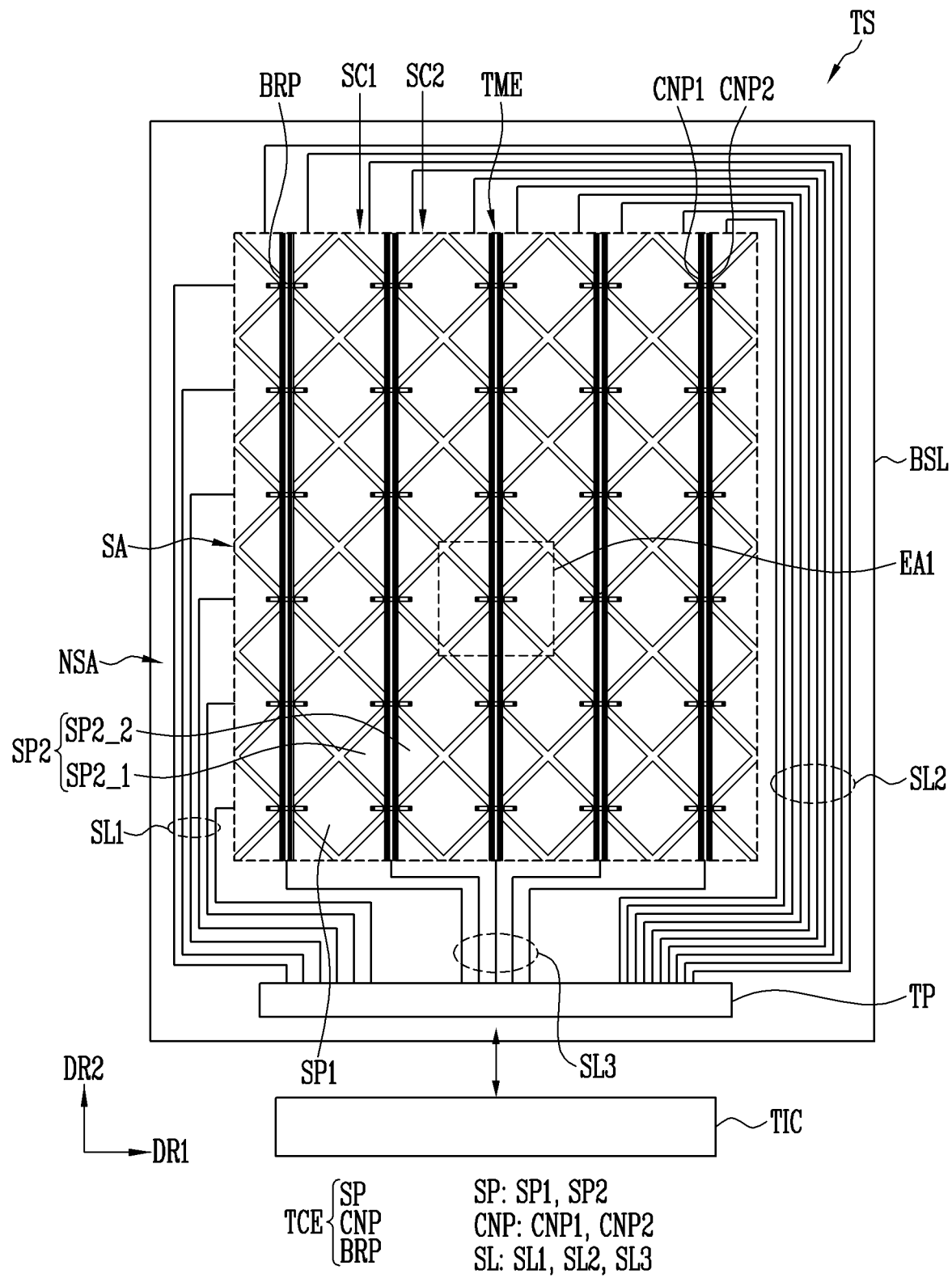
FIG. 8 is a schematic plan view of a touch sensor according to an embodiment.
Figure 9:
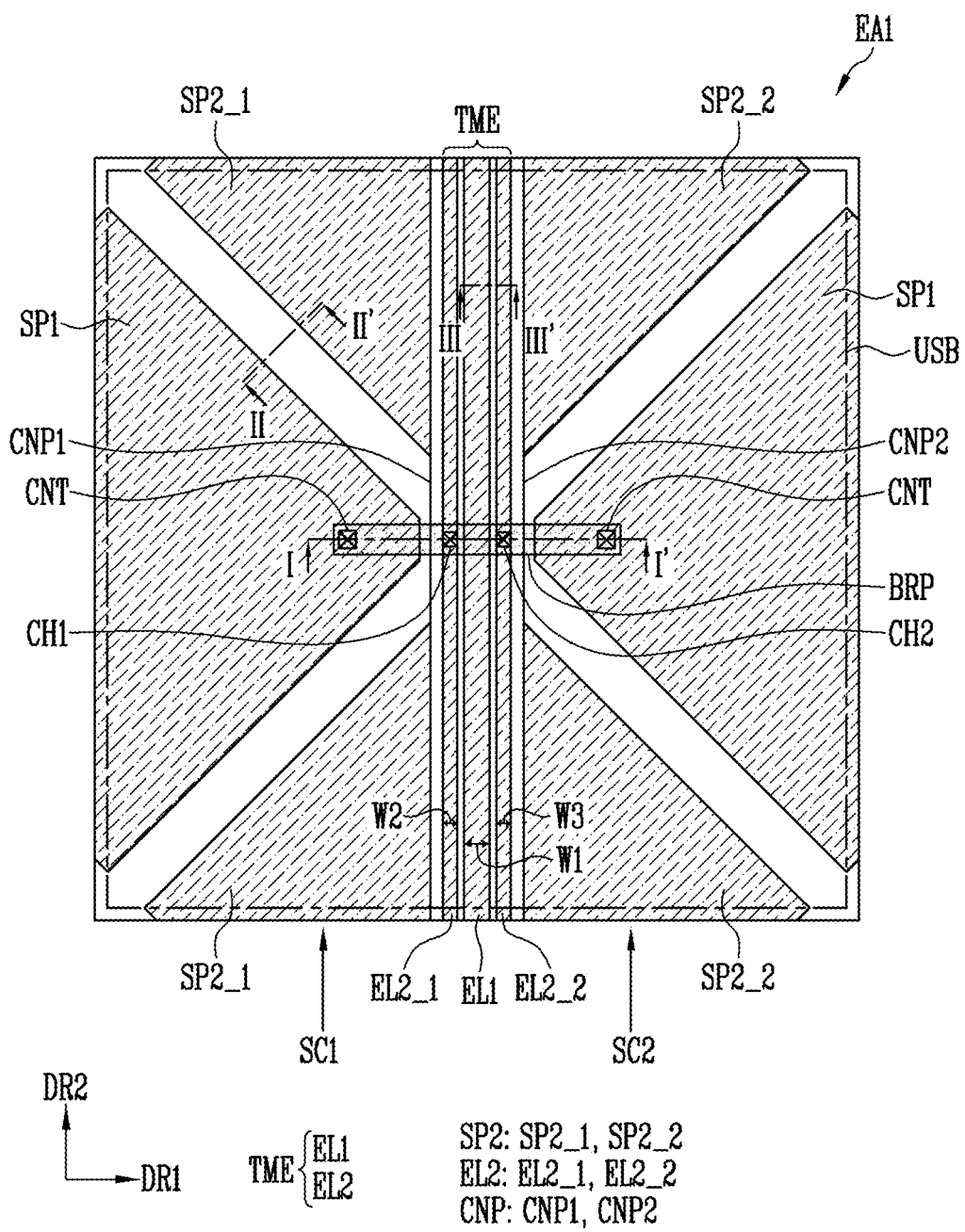
FIG. 9 is a schematic plan view of a portion EA1 of FIG. 8 according to an embodiment.
Figure 10:
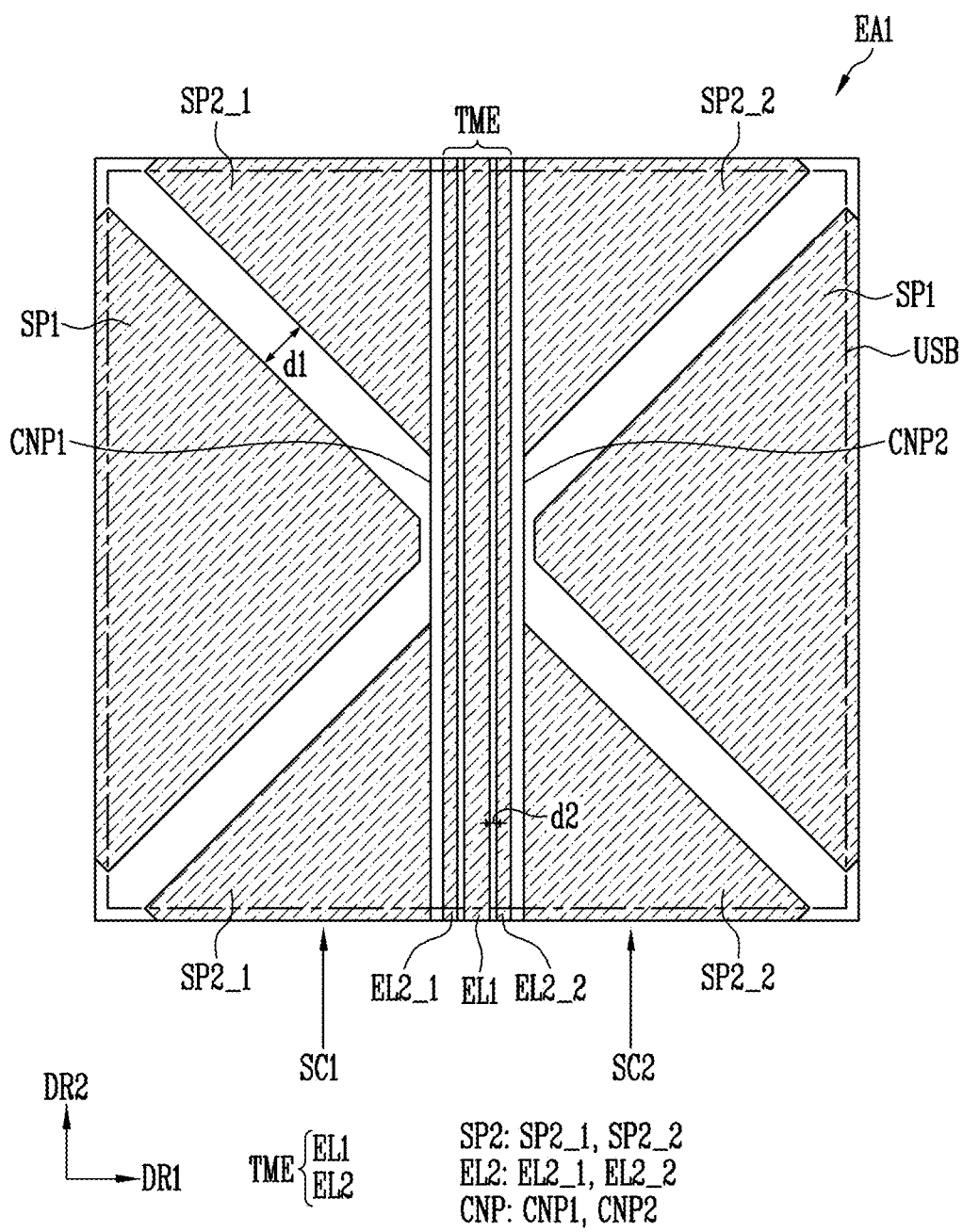
FIG. 10 is a schematic plan view illustrating a first touch conductive layer of a touch electrode of FIG. 9 according to an embodiment.
Figure 11:
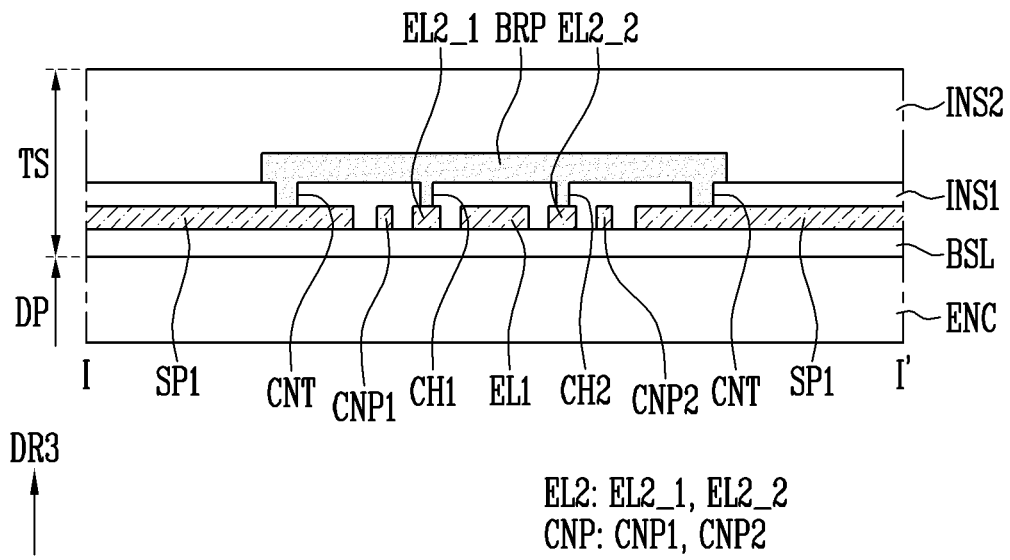
FIG. 11 is a schematic cross-sectional view taken along a line I-I' of FIG. 9 according to an embodiment.
Figure 12:
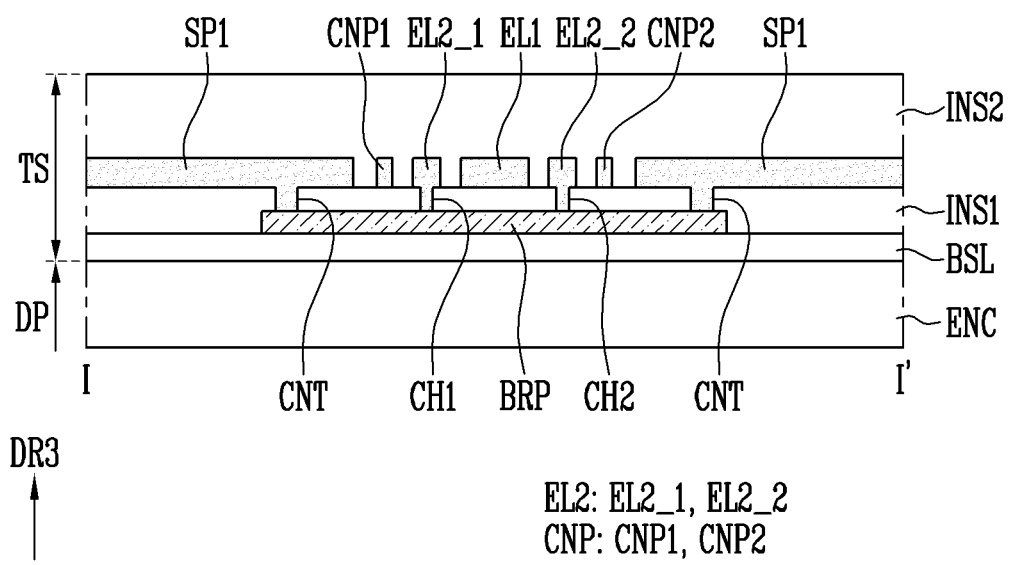
FIG. 12 is a schematic cross-sectional view taken along a line I-I' of FIG. 9 according to an embodiment.
Figure 13:
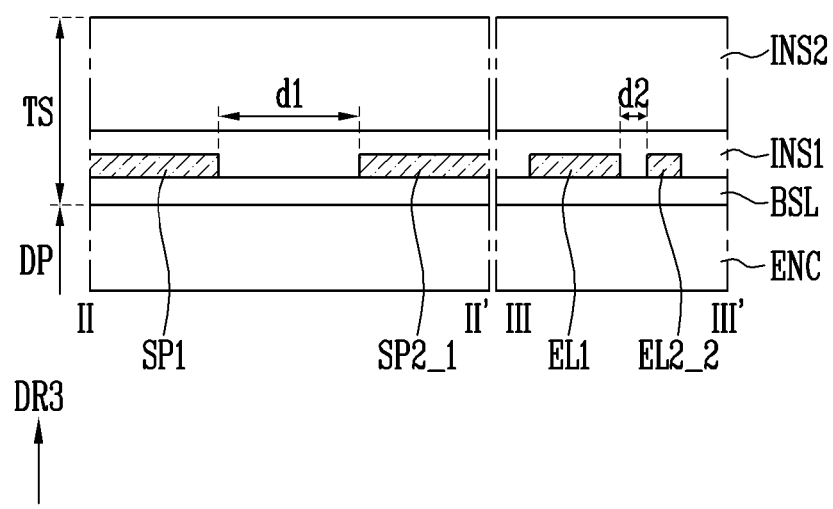
FIG. 13 is a schematic cross-sectional view taken along a line II-II' and a line III-III' of FIG. 9 according to an embodiment.
Figure 14:
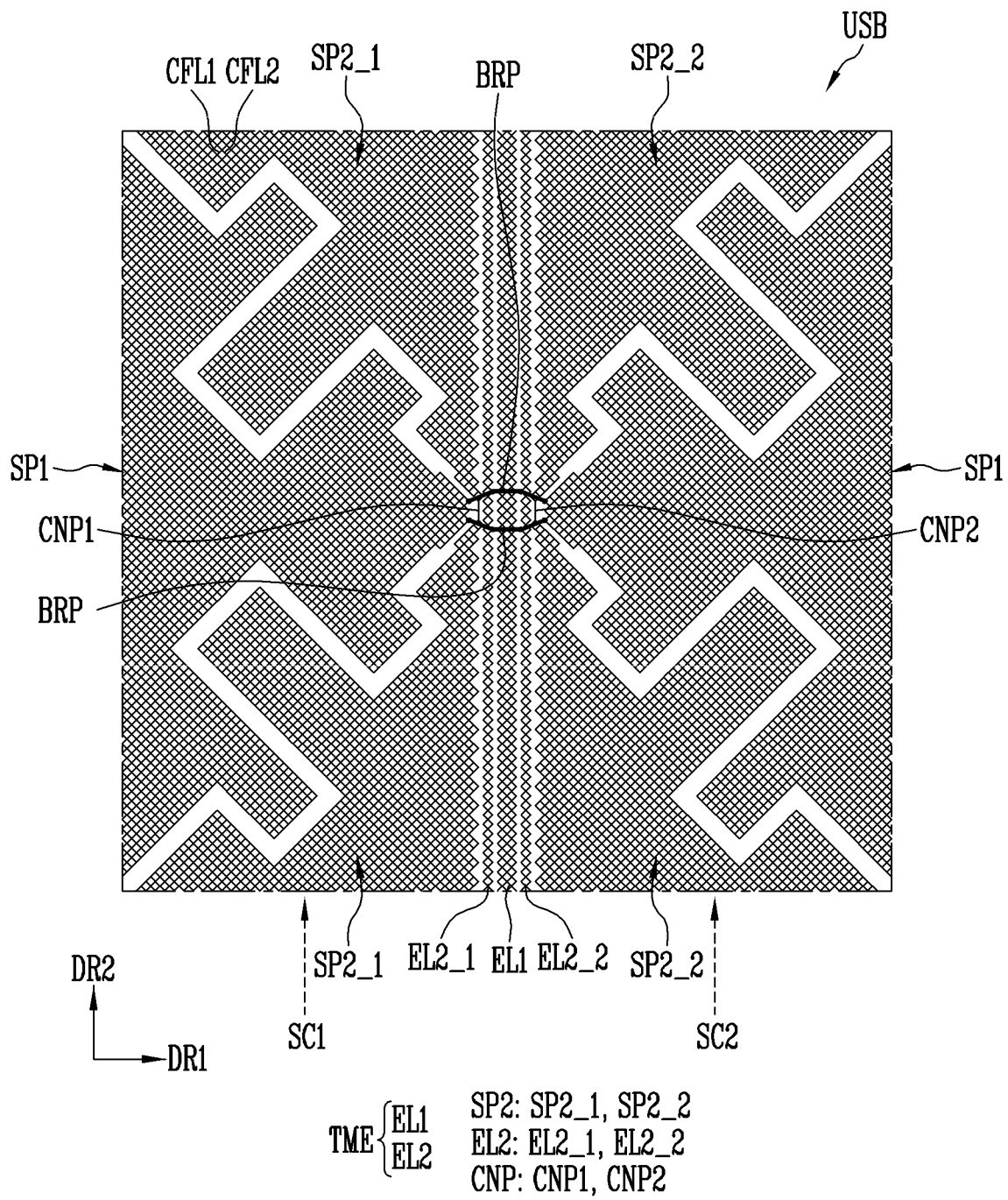
FIG. 14 is a schematic plan view illustrating a unit sensor block of FIG. 9 according to an embodiment.

FIG. 8 is a schematic plan view of a touch sensor TS according to an embodiment. FIG. 9 is a schematic plan view of a portion EA1 of FIG. 8 according to an embodiment. FIG. 10 is a schematic plan view illustrating a first touch conductive layer of a touch electrode of FIG. 9 according to an embodiment. Each of FIGS. 11 and 12 is a schematic cross-sectional view taken along a line I-I' of FIG. 9 according to an embodiment. FIG. 13 is a schematic cross-sectional view taken along a line II-II' and a line III-III' of FIG. 9 according to an embodiment. FIG. 14 is a schematic plan view illustrating a unit sensor block of FIG. 9 according to an embodiment.

FIG. 12 illustrates a positional/structural relationship between a touch electrode TCE (or touch electrode set TCE) and a temperature sensing electrode TME (or temperature sensing electrode set TME).

FIG. 14 illustrates elements included in a unit sensor block USB.

Referring to FIGS. 1 to 14, the touch sensor TS may include the base layer BSL. The base layer BSL may include a sensing area SA capable of sensing a touch input and may include a non-sensing area NSA surrounding at least a portion of the sensing area SA.

The base layer BSL may be formed of tempered glass, transparent plastic, a transparent film, or the like.

The sensing area SA may be provided in a central area of the base layer BSL and may overlap the display area DA of the display panel DP. The sensing area SA may have a shape substantially the same as that of the display area DA. The touch electrode TCE for sensing the touch input and the temperature sensing electrode TME for sensing a temperature change are disposed in the sensing area SA.

The non-sensing area NSA may be provided at an edge of the base layer BSL and may overlap the non-display area NDA of the display panel DP. Sensing lines SL (conductive lines) electrically connected to the touch electrode TCE and the temperature sensing electrode TME to receive and transmit touch sensing signals and/or temperature sensing signals may be provided in the non-sensing area NSA. A touch pad unit TP connected through the sensing lines SL to the touch electrode TCE and the temperature sensing electrode TME may be disposed in the non-sensing area NSA. The touch pad unit TP may include pads connected to the sensing lines SL. The touch pad unit TP may be electrically connected to a touch controller TIC, may supply a driving signal to each of the touch electrode TCE and the temperature sensing electrode TME, and may receive a sensing signal corresponding to a corresponding electrode to determine a touch position and sense a temperature change.

The touch electrode TCE may include a sensor pattern SP (or sensor pattern set SP), a connection pattern CNP (or connection pattern set CNP), and a bridge pattern BRP.

The sensor pattern SP may include first sensor patterns SP1 and second sensor patterns SP2. The first sensor patterns SP1 and the second sensor patterns SP2 may be electrically insulated from each other.

The first sensor patterns SP1 may be arranged and electrically connected in the first direction DR1 and may be electrically connected to adjacent first sensor patterns SP1 by bridge patterns BRP to form at least one sensing row. The second sensor patterns SP2 may be arranged and electrically connected in the second direction DR2 different from and/or perpendicular to the first direction DR1 and may be electrically connected to adjacent second sensor patterns SP2 through the connection pattern CNP to form at least one sense column.

Each of the sensor patterns SP1 and SP2 may be electrically connected to the touch pad TP through a corresponding sensing line SL. Some second sensor patterns SP2 may be a first driving element for receiving a first driving signal from the touch controller TIC through a corresponding sensing line SL, for example, a second sensing line SL2. The first driving signal may be a signal for sensing a touch of the user. Some first sensor patterns SP1 may be a first receiving electrode for transmitting a touch sensing signal to the touch controller TIC through a corresponding sensing line SL, for example, a first sensing line SL1.

The touch sensor TS may recognize the touch of the user by sensing a change amount of a mutual capacitance formed between first and second sensor patterns SP1 and SP2.

Each of the second sensor patterns SP2 may include a sub-pattern SP2_1 (or a first sub-pattern) and a sub-pattern SP2_2 (or a second sub-pattern). Sub-patterns SP2_1 arranged/aligned in the second direction DR2 may be electrically connected to each other through a corresponding connection pattern CNP, and sub-patterns SP2_1 arranged/aligned in the second direction DR2 may be electrically connected to each other through a corresponding connection pattern CNP. For example, two sub-patterns SP2_1 positioned immediately adjacent to each other in the second direction DR2 may be electrically connected to each other through a first connection pattern CNP1, and two sub-patterns SP2_2 positioned immediately adjacent to each other in the second direction DR2 may be electrically connected through a second connection pattern CNP2.

Sub-patterns SP2_1 electrically connected through at least one first connection pattern CNP1 may be arranged in the second direction DR2 to form a first sensing column SC1. Sub-patterns SP2_2 electrically connected through at least one second connection pattern CNP2 may be arranged in the second direction DR2 to form a second sensing column SC2 spaced from the first sensing column SC1.

The connection pattern CNP may be for electrically connecting second sensor patterns SP2 aligned in the second direction DR2, and may extend in the second direction DR2.

The first connection pattern CNP1 may have extend in the second direction DR2 and may electrically connect two sub-patterns SP2_1 adjacent in the second direction DR2. The second connection pattern CNP2 may extend in the second direction DR2 and may electrically connect two sub-patterns SP2_2 adjacent in the second direction DR2. The connection pattern CNP may be integrally formed with a corresponding second sensor pattern SP2. For example, the first connection pattern CNP1 may be integrally formed with a corresponding sub-pattern SP2_1, and the second connection pattern CNP2 may be integrally formed with a corresponding sub-pattern SP2_2. When the first connection pattern CNP1 is integrally provided with the corresponding sub-pattern SP2_1, the first connection pattern CNP1 may be a portion or extension of the corresponding sub-pattern SP2_1. When the second connection pattern CNP2 is integrally provided with the corresponding sub-pattern SP2_2, the second connection pattern CNP2 may be a portion or extension of the corresponding sub-pattern SP2_2.

Each bridge pattern BRP may be for electrically connecting two first sensor patterns SP1 arranged immediately adjacent to each other in the first direction DR1. Each of the bridge patterns BRP may extend in the first direction DR1.

When a touch event occurs, a change occurs in a mutual capacitance between the first sensor pattern SP1 and the second sensor pattern SP2 of a corresponding point. As the touch event occurs, a touch capacitance may be formed between two terminals of the mutual capacitance. The touch capacitance may include, for example, two capacitances connected in series. One of the touch capacitances may be formed between an input means (for example, a finger) and a sensor pattern to which a detection signal is applied among the first sensor pattern SP1 and the second sensor pattern SP2, for example, the second sensor pattern SP2. The other of the touch capacitances may be formed between the input means and the other sensor pattern among the first sensor pattern SP1 and the second sensor pattern SP2. The touch controller TIC may read out the touch sensing signal from the other sensor pattern, for example, the first sensor pattern SP1, and may determine a change amount of a capacitance occurring between before and after the input of the input means based on the touch sensing signal. The touch sensor TS may measure the change amount of the capacitance by sensing a current change of the touch sensing signal.

The temperature sensing electrode TME may be positioned between the first sensing column SC1 and the second sensing column SC2 in the sensing area SA. The temperature sensing electrode TME may be positioned between a sub-pattern SP2_1 of the first sensing column SC1 and a sub-pattern SP2_2 of the second sensing column SC2. The temperature sensing electrode TME may be positioned inside the touch electrode TCE.

The temperature sensing electrode TME may include a first electrode EL1 and a second electrode EL2 spaced from each other in the first direction DR1. The first electrode EL1 and the second electrode EL2 may be electrically insulated (or electrically isolated) from each other.

Each of the first and second electrodes EL1 and EL2 may have a bar shape extending in the second direction DR2 and having a constant (or uniform) width in the first direction DR1.

The first electrode EL1 may be electrically connected to a corresponding sensing line SL, for example, a third sensing line SL3. The first electrode EL1 may be electrically insulated from the sensor patterns SP. The first electrode EL1 may be a second driving electrode for receiving a second driving signal from the touch controller TIC through the third sensing line SL3. The second driving signal may be a signal for sensing a temperature change.

A width W1 of the first electrode EL1 in the first direction DR1 may be less than a width of a sensor pattern SP, for example, each of the first and second sensor patterns SP1 and SP2, in the first direction DR1. A size (or an area) of the first electrode EL1 may be less than a size (or an area) of each of the first and second sensor patterns SP1 and SP2. The width W1 of the first electrode EL1 in the first direction DR1 may be greater than or equal to the width(s) W2 and/or W3 of the second electrode EL2 in the first direction DR1.

The second electrode EL2 (or second electrode set EL2) may include a first sub-electrode EL2_1 and a second sub-electrode EL2_2 respectively disposed at two opposite sides of the first electrode EL1. The first sub-electrode EL2_1 and the second sub-electrode EL2_2 may be electrically connected to the first sensor pattern SP1 through the bridge pattern BRP. For example, the first sub-electrode EL2_1 may be electrically connected to the bridge pattern BRP through the first contact hole CH1, and the second sub-electrode EL2_2 may be electrically connected to the bridge pattern BRP through the second contact hole CH2. The second electrode EL2 may be a second receiving-transmitting electrode electrically connected to the first sensor pattern SP1 to transmit the temperature sensing signal to the touch controller TIC through the first sensor pattern SP1 and the first sensing line SL1.

A width W2 of the first sub-electrode EL2_1 in the first direction DR1 may be equal or unequal to a width W3 of the second sub-electrode EL2_2 in the first direction DR1. The width W2 of the first direction DR1 of the first sub-electrode EL2_1 and the width W3 of the first direction DR1 of the second sub-electrode EL2_2 may be less than the width W1 of the first direction DR1 of the first electrode EL1. Each of the width W2 of the first sub-electrode EL2_1 and the width W3 of the second sub-electrode EL2_2 may be less than the width of each of the first and second sensor patterns SP1 and SP2 in the first direction DR1. A size (or an area) of each of the first sub-electrode EL2_1 and the second sub-electrode EL2_2 may be less than the size (or the area) of each of the first and second sensor patterns SP1 and SP2.

Since the width (or the size) of each of the first electrode EL1 and the second electrode EL2 is less than the width (or the size) of each of the first and second sensor patterns SP1 and SP2, the first electrode EL1 and the second electrode EL2 may not affect the change amount of the mutual capacitance formed between the first sensor pattern SP1 and the second sensor pattern SP2 and caused by the touch of the user. Accordingly, the touch sensor TS capable of recognizing the touch by the user while sensing a change of an ambient temperature of the display device DD may include the temperature sensing electrode TME between the first sensing column SC1 and the second sensing column SC2 in the sensing area SA.

A distance d2 between the first electrode EL1 and the second electrode EL2 may be less than a distance d1 between a first sensor pattern SP1 and an immediately neighboring second sensor pattern SP2. Since the distance d2 between the first electrode EL1 and the second electrode EL2 is less than the distance d1 between the first sensor pattern SP1 and the second sensor pattern SP2, and since the width (or the size) of each of the first electrode EL1 and the second electrode EL2 is less than the width (or the size) of each of the first and second sensor patterns SP1 and SP2, the touch sensor TS for sensing a temperature change may not affect the change amount of the capacitance caused by the touch of the user.

The first adhesive layer ADL1 of the cover layer CVL (shown in FIG. 2) positioned on the touch sensor TS may be a gel state in which a significant dielectric constant change occurs according to a temperature change and may include a pressure-sensitive adhesive existing at a phase transition boundary. The dielectric constant change may affect the mutual capacitance formed between the first electrode EL1 and the second electrode EL2 of the temperature sensing electrode TME. When the temperature change occurs, an electric field of the first adhesive layer ADL1 may increase, and thus may affect the capacitance change of the touch sensor TS positioned directly under the first adhesive layer ADL1. The temperature sensing electrode TME may sense the ambient temperature change of the display device DD by recognizing the capacitance change corresponding to the electric field change of the first adhesive layer ADL1. Because the distance d2 between the first electrode EL1 and the second electrode EL2 is less than the distance d1 between the first sensor pattern SP1 and the second sensor pattern SP2, the capacitance change corresponding to the electric field change of the first adhesive layer ADL1 may be significant. Therefore, the touch controller TIC may read out the temperature sensing signal from the second electrode EL2 and may determine the change amount of the capacitance generated before and after the temperature change from the temperature sensing signal to sense the ambient temperature change of the display device DD. As the distance d1 between the first sensor pattern SP1 and the second sensor pattern SP2 is greater than the distance d2 between the first electrode EL1 and the second electrode EL2, the electric field change of the first adhesive layer ADL1 according to the temperature change may not affect the mutual capacitance formed between the first sensor pattern SP1 and the second sensor pattern SP2.

The touch sensor TS may be formed in a repetitive arrangement of the unit sensor block USB (indicated in FIG. 9 and FIG. 10). The unit sensor block USB may be a virtual unit block having a predetermined area including two (partial) first sensor patterns SP1 immediately neighboring each other in the first direction DR1 and two (partial) second sensor patterns SP2 immediately neighboring each other in the second direction DR2 in a corresponding sensing area. A unit sensor block USB may correspond to a minimum repetition unit of an arrangement of the sensor patterns SP in the corresponding sensing area. A temperature sensing electrode TME may be disposed in a center of each unit sensor block USB. One first sensor pattern SP1 and two sub-patterns SP2_1 electrically connected in the second direction DR2 by a first connection pattern CNP1 may be positioned at one side (for example, a left side) of the temperature sensing electrode TME. Another first sensor pattern SP1 and two sub-patterns SP2_2 electrically connected in the second direction by the second connection pattern CNP2 may be positioned at the other side (for example, a right side) of the temperature sensing electrode TME.

Because the temperature sensing electrode TME is positioned in each unit sensor block USB, a temperature change may be sensed for each unit sensor block.

The sensing lines SL may be positioned in the non-sensing area NSA, and may include first sensing lines SL1 electrically connected to the first sensor patterns SP1, second sensing lines SL2 electrically connected to the second sensor patterns SP2, and third sensing lines SL3 electrically connected to the first electrodes EL1.

The first sensing lines SL1 may electrically connect the first sensor patterns SP1 to the touch pad unit TP. Each first sensing line SL1 may electrically connect one sensing row (including first sensor patterns SP1 aligned in the first direction DR1) to a corresponding pad of the touch pad unit TP. Each first sensing line SL1 may be electrically connected to the second electrode EL2 of a temperature sensing electrode TME through a bridge pattern BRP.

The second sensing lines SL2 may electrically connect the second sensor patterns SP2 to the touch pad unit TP. Each second sensing line SL2 electrically connect one sensing column (including second sensor patterns SP2 aligned in the second direction DR2) to a corresponding pad of the touch pad unit TP.

The third sensing lines SL3 may electrically connect the first electrodes EL1 to the touch pad unit TP. Each third sensing line SL3 may electrically connect a first electrode EL1 (extending in the second direction DR2) to a corresponding pad of the touch pad unit TP.

Each of the second sensor patterns SP2 may receive a driving signal for touch sensing from the touch controller TIC through a corresponding second sensing line SL2. Each of the first sensor patterns SP1 may transmit a touch sensing signal to the touch controller TIC through a corresponding first sensing line SL1. Each of the first electrodes EL1 may receive a driving signal for temperature change sensing from the touch controller TIC through a corresponding third sensing line SL3. Each of the second electrodes EL2 may transmit a temperature sensing signal to the touch controller TIC through a corresponding sensing line SL2.

The touch controller TIC may distinguish whether the capacitance change in each unit sensor block USB of the touch sensor TS is caused by a touch event or caused by a temperature change may sense the temperature change while sensing the touch event. Since the touch electrode TCE and the temperature sensing electrode TME include separate electrodes, the touch controller TIC may distinguish profiles (characteristics) of the touch electrode TCE and the temperature sensing electrode TME. The touch controller TIC may obtain a touch profile (i.e., touch-related characteristics) of each unit sensor block USB related to the corresponding first sensor patterns SP1 and second sensor patterns SP2, and may obtain a temperature profile (i.e., temperature-related characteristics) of the unit sensor block USB related to the corresponding first electrode EL1 and second electrode EL2 (which is electrically connected to the first sensor patterns SP1).

The unit sensor block USB of the touch electrode TCE may have a mesh structure (or shape) to prevent the unit sensor block USB from being visible or conspicuous to the user. Each of the first sensor pattern SP1, the sub-pattern SP2_1, and the sub-pattern SP2_2 may have a mesh structure, as shown in FIG. 14. The mesh structure may include first conductive thin lines CFL1, second conductive thin lines CFL2 crossing the first conductive thin lines CFL1, and mesh openings. The mesh openings may each be surrounded by sections of first conductive thin lines CFL1 and sections of second conductive thin lines CFL2.

When the first sensor pattern SP1, the sub-pattern SP2_1, and the sub-pattern SP2_2 have a mesh shape, an area where the touch electrode TCE and the display panel DP overlap each other may be reduced by the mesh openings. Accordingly, an unwanted parasitic capacitance generated between the touch electrode TCE and the electrodes of the display panel DP may be advantageously reduced.

The temperature sensing electrode TME may also have a mesh structure. Each of the first electrode EL1 and the second electrode EL2 may have a mesh structure.

The touch electrode TCE including the sensor pattern SP, the connection pattern CNP, and the bridge pattern BRP may be provided on the base layer BSL.

The base layer BSL may be provided on the encapsulation layer ENC of the display panel DP.

The base layer BSL (shown in at least FIG. 7, FIG. 11, and FIG. 12) may be an uppermost layer of the encapsulation layer ENC of the display panel DP. For example, the base layer BSL may be an inorganic insulating layer that is the uppermost layer of the encapsulation layer ENC. The base layer BSL may be an inorganic insulating layer (or an inorganic buffer layer) disposed on the encapsulation layer ENC. The inorganic insulating layer may include one or more of the materials suitable for at least one of the first and second insulating layers INS1 and INS2. The base layer BSL may be an encapsulation substrate. The encapsulation layer ENC may be optional.

The first touch conductive layer CL1 (shown in at least FIG. 7) may be disposed between the base layer BSL and the first insulating layer INS1. The second touch conductive layer CL2 (shown in at least FIG. 7) may be disposed between the first insulating layer INS1 and the second insulating layer INS2.

Referring to FIG. 11, the first touch conductive layer CL1 may include a first sensor pattern SP1, a first connection pattern CNP1, a second connection pattern CNP2, a first electrode EL1, a first sub-electrode EL2_1, and a second sub-electrode EL2_2. In addition, the first touch conductive layer CL1 may include a second sensor pattern SP2. The first and second sensor patterns SP1 and SP2, the first and second connection patterns CNP1 and CNP2, the first electrode EL1, and the first and second sub-electrodes EL1_2 and EL2_2 described above may be disposed between the base layer BSL and the first insulating layer INS1.

The first insulating layer INS1 may be disposed on the first touch conductive layer CL1. The first insulating layer INS1 may include an organic insulating layer including an organic material or may include an inorganic insulating layer including an inorganic material.

The second touch conductive layer CL2 may be disposed on the first insulating layer INS1. The second touch conductive layer CL2 may include a bridge pattern BRP. The bridge pattern BRP may be electrically connected to the first sensor patterns SP1 through a hole CNT passing through the first insulating layer INS1. The bridge pattern BRP may be electrically connected to the first sub-electrode EL2_1 through the first contact hole CH1 spaced from the hole CNT and passing through the first insulating layer INS1. The bridge pattern BRP may be electrically connected to the second sub-electrode EL2_2 through the second contact hole CH2 spaced from the holes CNT and CH1 and passing through the first insulating layer INS1. The first sensor patterns SP1 and the second electrode EL2 may be electrically connected to each other through the bridge pattern BRP.

The second insulating layer INS2 may be disposed on the bridge pattern BRP, which may be part of the second touch conductive layer CL2. The second insulating layer INS2 may prevent the second touch conductive layer CL2 including the bridge pattern BRP from being exposed to the outside, for preventing corrosion of the second touch conductive layer CL2. The second insulating layer INS2 may be formed of an organic insulating layer formed of an organic material. The organic material may include at least one of acryl, polyimide (PI), polyamide (PA), and benzocyclobutene (BCB). The second insulating layer INS2 may be transparent and may have fluidity. Therefore, the second insulating layer INS2 may alleviate protrusions of an underlying structure and may planarize the underlying structure. The second insulating layer INS2 may be formed of an inorganic insulating layer including an inorganic material.

Referring to FIG. 12, the bridge pattern BRP may be included in the first touch conductive layer CL1 (between the layers BSL and INS1). The first and second sensor patterns SP1 and SP2, the first and second connection patterns CNP1 and CNP2, and the first and second electrodes EL1 and EL2 may be included in the second touch conductive layer CL2 (between the layers INS1 and INS2).

According to embodiments, the temperature sensing electrode TME may be positioned between the first sensing column SC1 and the second sensing column SC2 of the touch electrode TCE in each unit sensor block USB in the sensing area SA. Therefore, the touch by the user may be recognized by the display device when the display device DD senses the ambient temperature change.

According to embodiments, the distance d2 between the first electrode EL1 and the second electrode EL2 of the temperature sensing electrode TME may be less than the distance d1 between the first sensor pattern SP1 and the second sensor patterns SP2 of the touch electrode TCE. Therefore, the mutual capacitance change occurring between the first electrode EL1 and the second electrode EL2 caused by the dielectric constant change of the first adhesive layer ADL1 according to the temperature change may be effectively sensed.

According to embodiments, the width and/or area of each of the first electrode EL1 and the second electrode EL2 of the temperature sensing electrode TME in each unit sensor block UBS may be less than the width and/or area of each of the first and second sensor patterns SP1 and SP2 of the touch electrode TCE in the unit sensor block UBS. Therefore, the capacitance formed between the first electrode EL1 and the second electrode EL2 may not significantly affect the capacitance change between the first sensor pattern SP1 and the second sensor pattern SP2 caused by a touch.

Figure 15:
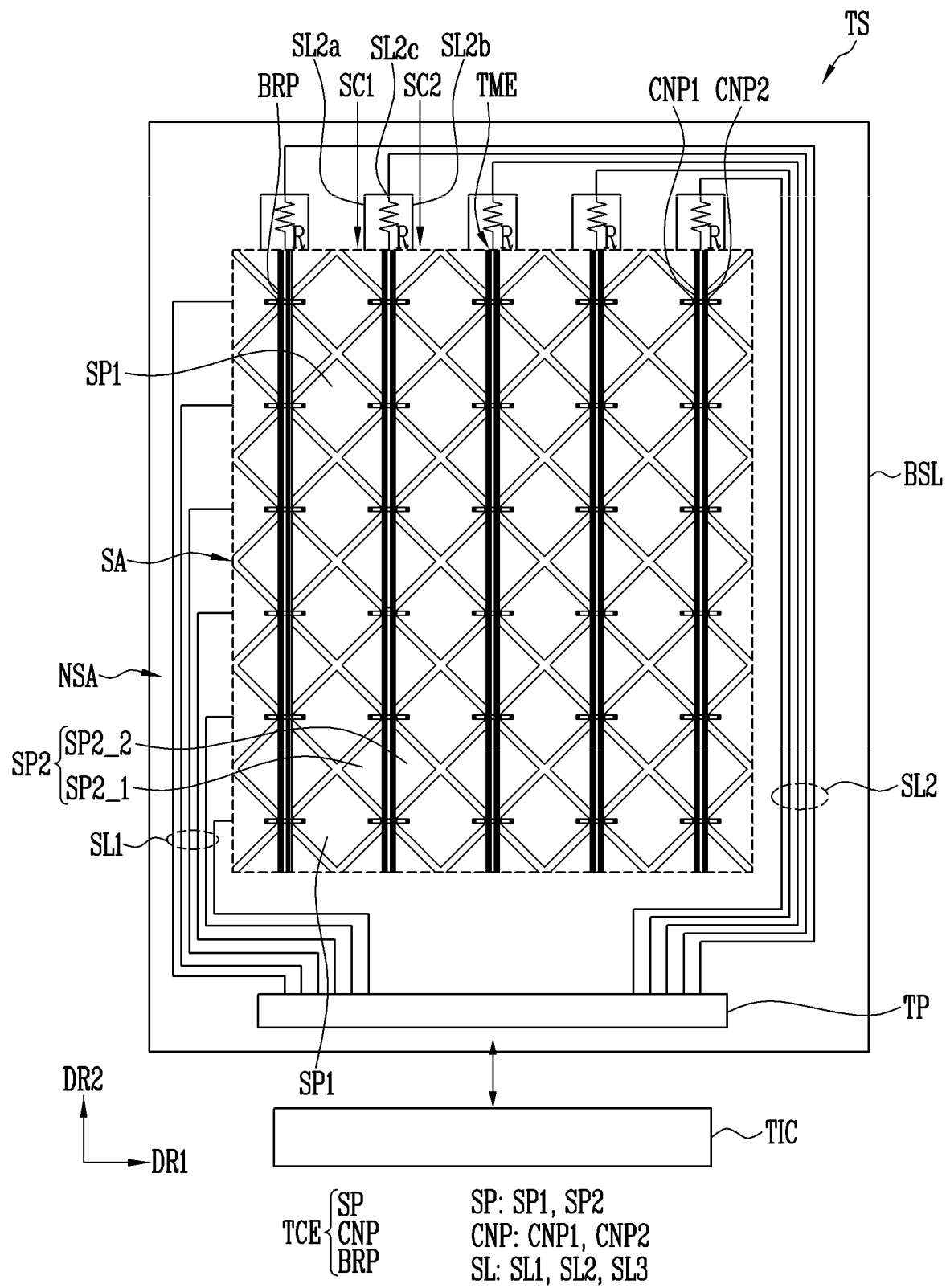
FIG. 15 is a schematic plan view illustrating a touch sensor according to an embodiment.

FIG. 15 is a schematic plan view illustrating a touch sensor TS according to an embodiment.

The touch sensor TS illustrated in FIG. 15 may include features that are analogous to or identical to features described with reference to one or more of FIGS. 1 to 14.

Referring to FIGS. 1 to 7 and 15, the first sensing lines SL1 and the second sensing lines SL2 may be disposed in the non-sensing area NSA of the touch sensor TS.

The first sensing lines SL1 may electrically connect the first sensor patterns SP1 to the touch pad unit TP. Each first sensing line SL1 may electrically connect one sensing row (including first sensor patterns SP1 aligned in the first direction DR1) to a corresponding pad of the touch pad unit TP. Each first sensing line SL1 may be electrically connected to a second electrode EL2 (shown in FIG. 9) of the temperature sensing electrode TME through a bridge pattern BRP.

The second sensing lines SL2 may be electrically connected between the second sensor patterns SP2 and the touch pad unit TP. For example, each second sensing line SL2 may be electrically connected between the sub-patterns SP2_1 of a first sensing column SC1 and a corresponding pad of the touch pad unit TP, and may be electrically connected between the sub-patterns SP2_2 of a second sensing column SC2 and the corresponding pad of the touch pad unit TP.

Each second sensing line SL2 may be electrically connected to the first electrode EL1 (shown in FIG. 9) of the temperature sensing electrode TME positioned between the first sensing column SC1 and the second sensing column SC2. The second sensor pattern SP2 of the touch electrode TCE and the first electrode EL1 of the temperature sensing electrode TME may be connected to the same second sensing line SL2. The sub-patterns SL2_1 of the first sensing column SC1 may be electrically connected through a first sub-line SL2a to the second sensing line SL2, the sub-patterns SL2_2 of the second sensing column SC2 may be electrically connected through a second sub-line SL2b to the second sensing line SL2, and the first electrode EL1 of the temperature sensing electrode TME positioned between the first sensing column SC1 and the second sensing column SC2 may be electrically connected through a third sub-line SL2c to the second sensing line SL2.

A resistor R may be electrically connected between the third sub-line SL2c and the first electrode EL1. A line resistance between the corresponding pad of the touch pad unit TP and the first electrode EL1 may be different from a line resistance between the corresponding pad of the touch pad unit TP and each of the first and second sensing columns SC1 and SC2, because of the resistance R. Even though the touch electrode TCE and the temperature sensing electrode TME are electrically connected to the same second sensing line SL2, driving frequencies may be different for the touch electrode TCE and the temperature sensing electrode TME because of the line resistance difference. Therefore, the touch controller TIC may provide first and second driving signals having different frequencies through the same second sensing line SL2 to the second sensor pattern SP2 of the touch electrode TCE and to the first electrodes EL1 of the temperature sensing electrode TME.

Since the second sensor pattern SP2 of the touch electrode TCE and the first electrode EL1 of the temperature sensing electrode TME are connected to the same second sensing line SL2, the number of sensing lines SL positioned in the non-sensing area NSA may be reduced. Advantageously, the non-sensing area NSA may be minimized.

Figure 16:
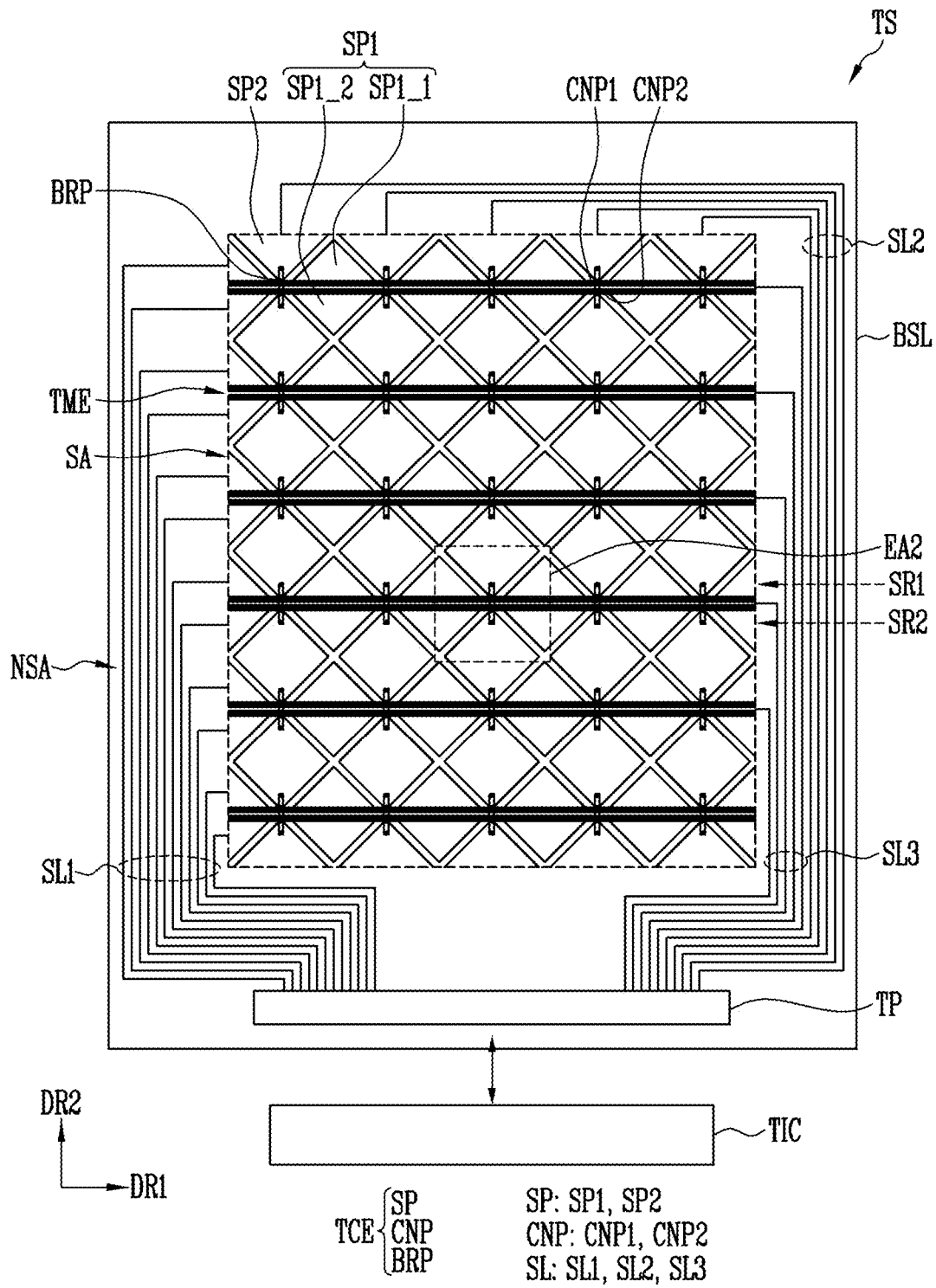
FIG. 16 is a schematic plan view illustrating a touch sensor according to an embodiment.
Figure 17:
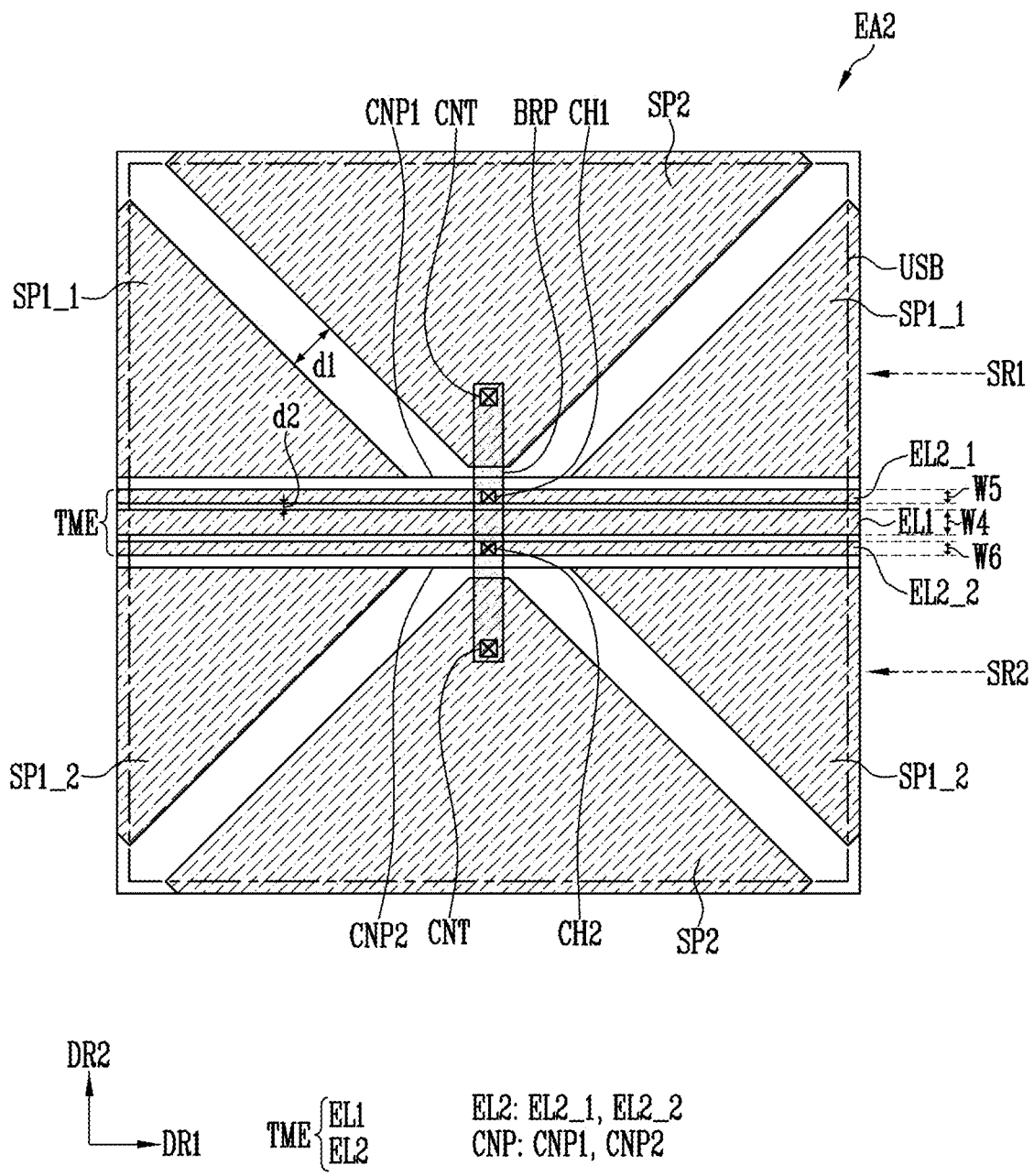
FIG. 17 is a schematic plan view of a portion EA2 of FIG. 16 according to an embodiment.

FIG. 16 is a schematic plan view illustrating a touch sensor TS according to an embodiment. FIG. 17 is a schematic plan view of a portion EA2 of FIG. 16 according to an embodiment.

The touch sensor illustrated in FIGS. 16 and 17 may include features that are analogous to or identical to features described with reference to one or more of FIGS. 1 to 15.

Referring to FIGS. 1 to 7, 16, and 17, the touch sensor TS may include the touch electrode TCE and the temperature sensing electrode TME positioned in the sensing area SA.

The touch electrode TCE may include the sensor pattern SP, the connection pattern CNP, and the bridge pattern BRP.

The sensor pattern SP may include first sensor patterns SP1 and the second sensor patterns SP2.

First sensor patterns SP1 may be arranged in the first direction DR1 and may be electrically connected to the adjacent first sensor patterns SP1 through the connection pattern CNP to form at least one sensing row. Second sensor patterns SP2 may be arranged in the second direction DR2 different from the first direction DR1 and may be electrically connected to the adjacent second sensor patterns SP2 by bridge patterns BRP to form at least one sensing column.

Each of the first sensor patterns SP1 may include a sub-pattern SP1_1 (or the first sub-pattern) and a sub-pattern SP1_2 (or the second sub-pattern). The sub-patterns SP1_1 arranged in the first direction DR1 may be electrically connected to each other through a corresponding connection pattern CNP. The sub-patterns SP1_2 arranged in the first direction DR1 may be electrically connected to each other through a corresponding connection pattern CNP. Two sub-patterns SP1_1 positioned immediately adjacent to each other in the first direction DR1 may be electrically connected to each other through a first connection pattern CNP1. Two sub-patterns SP1_2 positioned immediately adjacent to each other in the first direction DR1 may be electrically connected to each other through a second connection pattern CNP2.

Multiple sub-patterns SP1_1 electrically connected through a first connection pattern CNP1 may be arranged in the first direction DR1 to form a first sensing row SR1. Multiple sub-patterns SP1_2 electrically connected through a second connection pattern CNP2 may form a second sensing row SR2 extending in the first direction DR1.

The connection pattern CNP may electrically connect first sensor patterns SP1 arranged in the first direction DR1, and may extend in the first direction DR1. A first connection pattern CNP1 may extend in the first direction DR1 and may electrically connect two sub-patterns SP1_1 adjacent to each other in the first direction DR1. A second connection pattern CNP2 may extend in the first direction DR1 and may electrically connect two sub-patterns SP1_2 adjacent to each other in the first direction DR1. The connection pattern CNP may be integrally formed with a corresponding first sensor pattern SP1. The first connection pattern CNP1 may be integrally formed with a corresponding sub-pattern SP1_1, and the second connection pattern CNP2 may be integrally formed with a corresponding sub-pattern SP1_2. The first connection pattern CNP1 may be a portion or extension of the corresponding sub-pattern SP1_1. The second connection pattern CNP2 may be a portion or extension of the corresponding sub-pattern SP1_2.

Each of bridge patterns BRP may electrically connect two second sensor patterns SP2 adjacent to each other in the second direction DR2. Each of the bridge patterns BRP may extend in the second direction DR2.

A temperature sensing electrode TME may be positioned between a first sensing row SR1 and a second sensing row SR2 in the sensing area SA. The temperature sensing electrode TME may be positioned between a sub-pattern SP1_1 of the first sensing row SR1 and a sub-pattern SP1_2 of the second sensing row SR2.

The temperature sensing electrode TME may include a first electrode EL1 and a second electrode EL2 spaced from each other in the second direction DR2. The first electrode EL1 and the second electrode EL2 may be electrically isolated from each other.

Each of the first and second electrodes EL1 and EL2 may have a bar shape extending in the first direction DR1 and having a constant width in the second direction DR2.

The first electrode EL1 may be electrically connected to a corresponding sensing line SL, for example, a third sensing line SL3. The first electrode EL1 may be electrically insulated from the sensor patterns SP.

A width W4 of the first electrode EL1 in the second direction DR2 may be less than the width of each of the first and second sensor patterns SP1 and SP2 in the second direction DR2. The size (or the area) of the first electrode EL1 may be less than the size (or the area) of each of the first and second sensor patterns SP1 and SP2. The width W4 of the first electrode EL1 may be greater than or equal to a width of the second electrode EL2 in the second direction DR2.

The second electrode EL2 may include a first sub-electrode EL2_1 and a second sub-electrode EL2_2 respectively positioned at two opposite sides of the first electrode EL1. The first sub-electrode EL2_1 and the second sub-electrode EL2_2 may be electrically connected to a first sensor pattern SP1 through a bridge pattern BRP. The first sub-electrode EL2_1 may be electrically connected to the bridge pattern BRP through a first contact hole CH1. The second sub-electrode EL2_2 may be electrically connected to the bridge pattern BRP through a second contact hole CH2. The second electrode EL2 may be the second receiving-transmitting electrode electrically connected to the first sensor pattern SP1 to transmit the temperature sensing signal to the touch controller TIC through the first sensor pattern SP1 and the first sensing line SL1.

A width W5 of the first sub-electrode EL2_1 in the second direction DR2 and a width W6 of the second sub-electrode EL2_2 in the second direction DR2 may be equal or unequal to each other. The width W5 of the first sub-electrode EL2_1 and the width W6 of the second sub-electrode EL2_2 may each be less than the width W4 of the first electrode. The width W5 of the first sub-electrode EL2_1 and the width W6 of the second sub-electrode EL2_2 may each be less than the width of each of the first and second sensor patterns SP1 and SP2 in the second direction DR2. The size (or the area) of each of the first sub-electrode EL2_1 and the second sub-electrode EL2_2 may be less than the size (or the area) of the first and second sensor patterns SP1 and SP2.

The distance d2 between the first electrode EL1 and the second electrode EL2 may be less than the distance d1 between a corresponding first sensor pattern SP1 and a corresponding second sensor pattern SP2. Because the distance d2 between the first electrode EL1 and the second electrode EL2 is less than the distance d1 between the first sensor pattern SP1 and the second sensor pattern SP2, and because the width (or the size) of each of the first electrode EL1 and the second electrode EL2 is less than the width (or the size) of each of the first and second sensor patterns SP1 and SP2, the touch sensor TS may effectively sense the ambient temperature change of the display device DD without affecting the capacitance change caused by the touch of the user.

According to embodiments, the touch by the user may be recognized by the display device DD when the display device DD senses the ambient temperature change.

Figure 18:
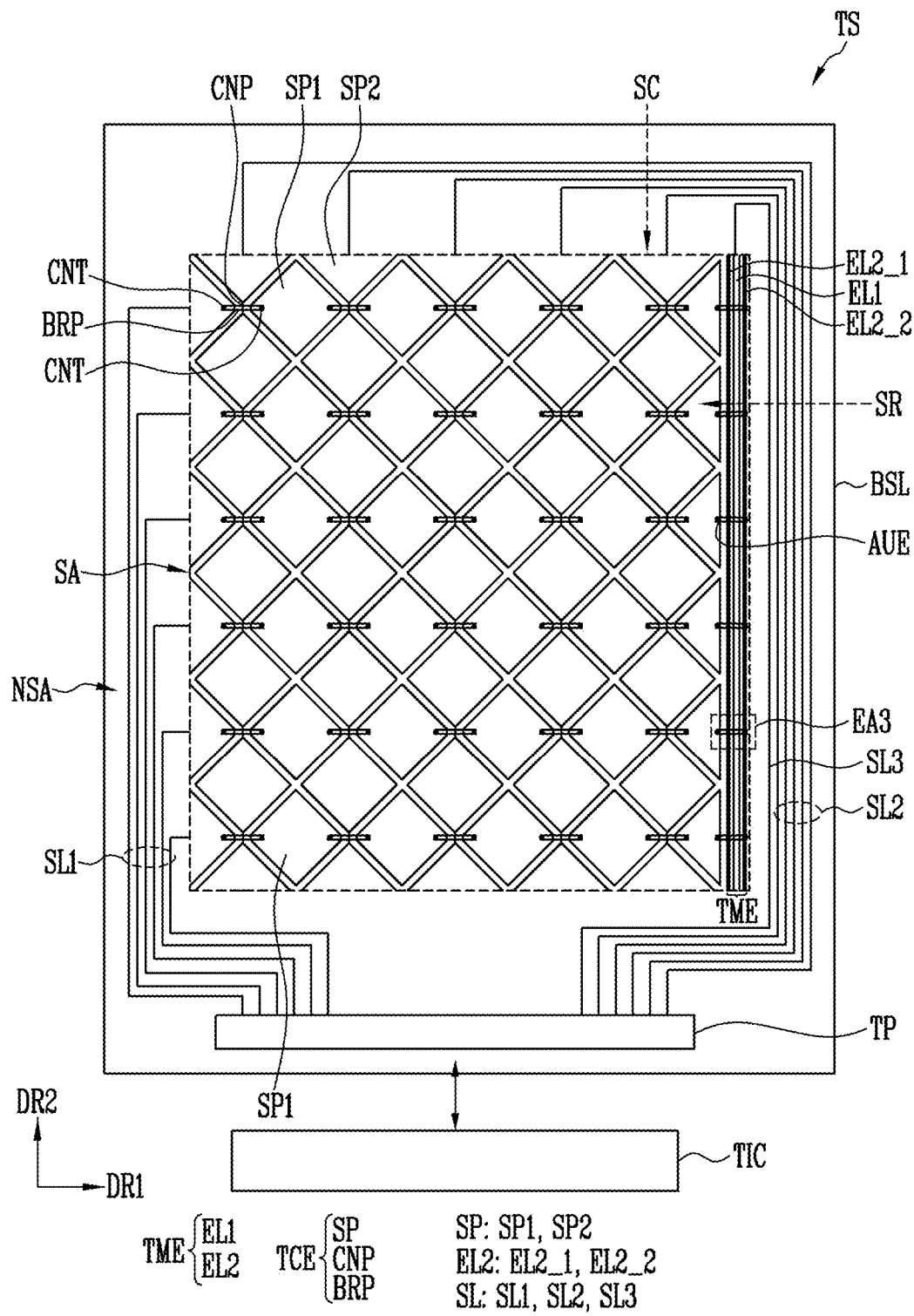
FIG. 18 is a schematic plan view illustrating a touch sensor according to an embodiment.
Figure 19:
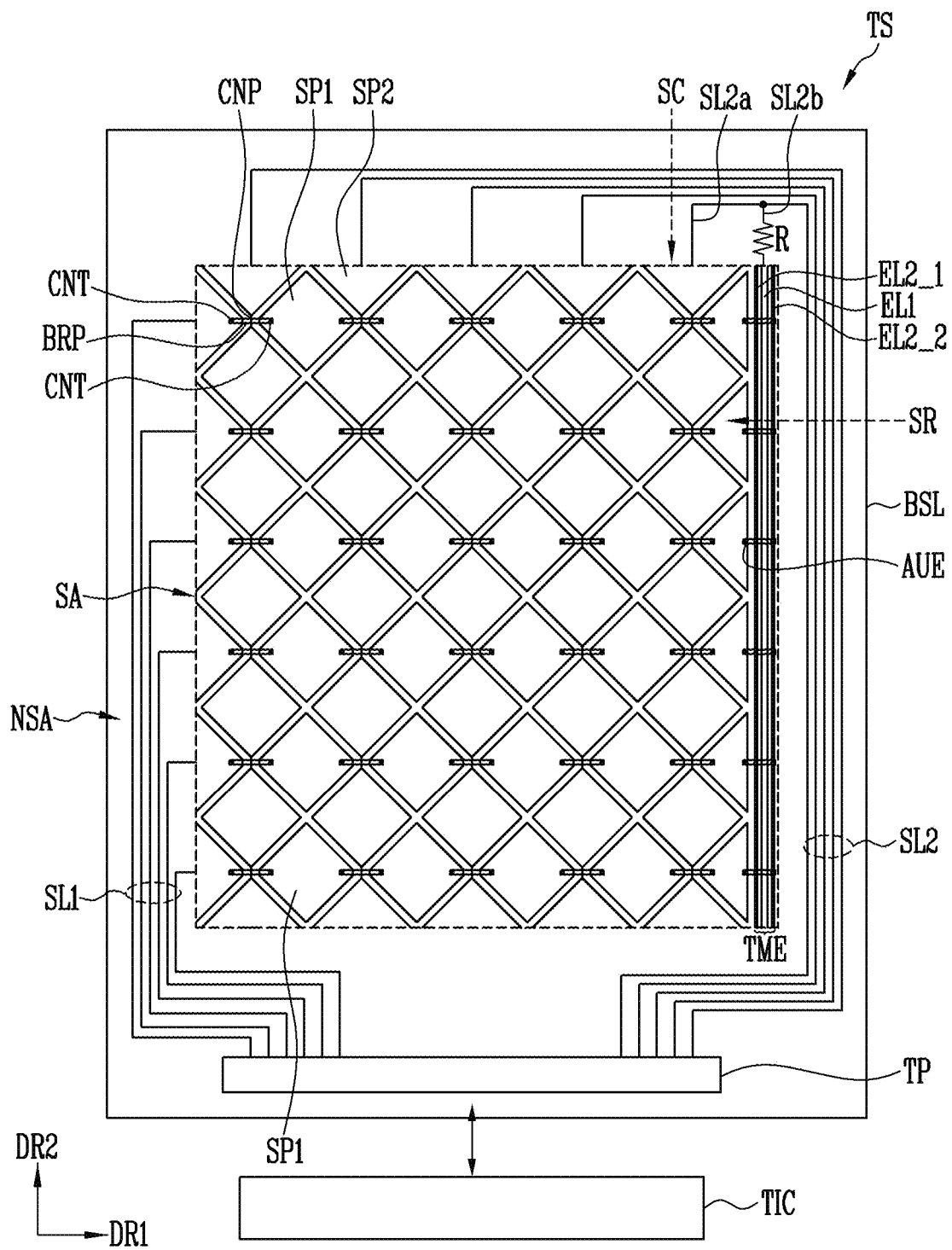
FIG. 19 is a schematic plan view illustrating a touch sensor according to an embodiment.
Figure 20:
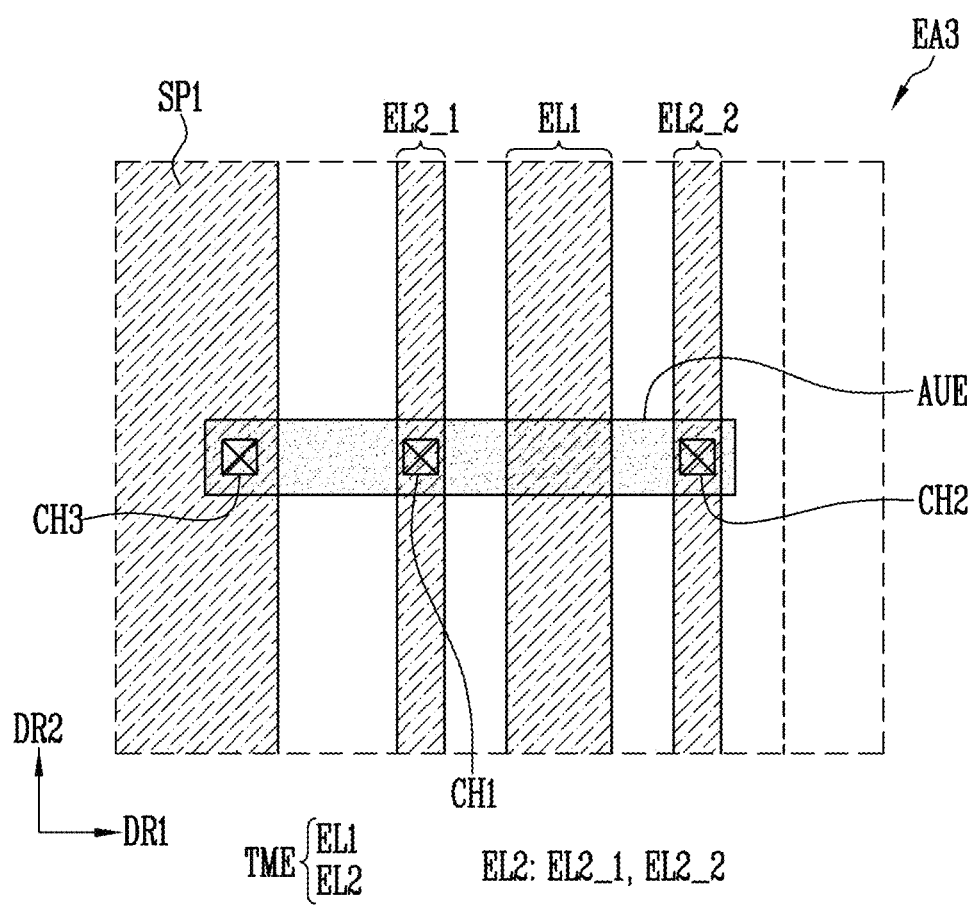
FIG. 20 is a schematic plan view of a portion EA3 of FIG. 18 according to an embodiment.

Each of FIGS. 18 and 19 is a schematic plan view illustrating a touch sensor TS according to an embodiment. FIG. 20 is a schematic plan view of a portion EA3 of FIG. 18 according to an embodiment.

The touch sensors TS illustrated in FIGS. 18 to 20 may include features that are analogous to or identical to features described with reference to one or more of FIGS. 1 to 17.

Referring to FIGS. 1 to 7 and 18 to 20, the touch sensor TS may include a touch electrode TCE and a temperature sensing electrode TME disposed in the sensing area SA.

The touch electrode TCE may include a sensor pattern SP, a connection pattern CNP, and a bridge pattern BRP.

The sensor pattern SP may include first sensor patterns SP1 and the second sensor patterns SP2.

Multiple first sensor patterns SP1 may be arranged in the first direction DR1 and may be electrically connected to the adjacent first sensor patterns SP1 through the bridge patterns BRP to form at least one sensing row SR. Multiple second sensor patterns SP2 may be arranged in the second direction DR2 different from the first direction DR1 and may be electrically connected to the adjacent second sensor patterns SP2 by the connection patterns CNP to form at least one sensing column SC.

The first sensor patterns SP1 may be a first receiving-transmitting electrode for transmitting a touch sensing signal to the touch controller TIC through a corresponding sensing line SL, for example, a first sensing line SL1. The second sensor patterns SP2 may be a first driving electrode for receiving a first driving signal from the touch controller TIC through a corresponding sensing line SL, for example, a second sensing line SL2.

A connection pattern CNP may electrically connect two second sensor patterns SP2 arranged adjacent to each other in the second direction DR2, and may extend in the second direction DR2. A bridge pattern BRP may electrically connect two first sensor patterns SP1 arranged adjacent to each other in the first direction DR1, and may extend in the first direction DR1.

The temperature sensing electrode TME may be spaced from the touch electrode TCE in the sensing area SA. The temperature sensing electrode TME may be positioned on a right side of the sensing area SA and may be spaced from the touch electrode TCE in a plan view of the touch sensor TS. The temperature sensing electrode TME may be positioned outside the touch electrode TCE in the sensing area SA.

The temperature sensing electrode TME may include a first electrode EL1 and a second electrode EL2 spaced from each other. The first electrode EL1 and the second electrode EL2 may be electrically isolated from each other. Each of the first and second electrodes EL1 and EL2 may have a bar shape extending in the second direction DR2 and having a constant width in the first direction DR1.

The first electrode EL1 may be electrically connected to the third sensing line SL3. The first electrode EL1 may be electrically insulated from the sensor patterns SP. The first electrode EL1 may be a second driving electrode for receiving a second driving signal from the touch controller TIC through the third sensing line SL3. The second driving signal may be a signal for sensing the temperature change.

The second electrode EL2 may include a first sub-electrode EL2_1 and a second sub-electrode EL2_2 respectively disposed at two opposite sides of the first electrode EL1. The first sub-electrode EL2_1 and the second sub-electrode EL2_2 may be electrically connected to the first sensor pattern SP1 through an auxiliary electrode AUE. The auxiliary electrode AUE may electrically connect the second electrode EL2 of the temperature sensing electrode TME to a first sensor pattern SP1 of the touch electrode TCE, and may extend in the first direction DR1. The auxiliary electrode AUE may be formed in the same process as the bridge patterns BRP, may include the same material as the bridge patterns BRP, and may be provided in the same layer as the bridge patterns BRP. The first sub-electrode EL2_1 may be electrically connected to the auxiliary electrode AUE through a first contact hole CH1. The second sub-electrode EL2_2 may be electrically connected to the auxiliary electrode AUE through a second contact hole CH2, the first sensor pattern SP1 disposed closest to the first sub-electrode EL2_1 may be electrically connected to the auxiliary electrode AUE through a third contact hole CH3. The second electrode EL2 may transmit a temperature sensing signal to the touch controller TIC through the first sensor pattern SP1 and the corresponding first sensing line SL1.

According to embodiments, the display device may recognize the touch by the user may be when sensing the ambient temperature change.

A second sensing line SL2 may be electrically connected to the second sensor patterns SP2 of a sensing column SC and the first electrode EL1 of the temperature sensing electrode TME, as shown in FIG. 19. The second sensor patterns SP2 of the sensing column SC and the first electrode EL1 of the temperature sensing electrode TME may be electrically connected to the same second sensing line SL2. The second sensor patterns SP2 of the sensing column SC may be electrically connected through a first sub-line SL2a branched to the second sensing line SL2. The first electrode EL1 of the temperature sensing electrode TME may be electrically connected through a second sub-line SL2b to the second sensing line SL2.

A resistor R may be electrically connected between the second sub-line SL2b and the first electrode EL1. A line resistance between the touch pad unit TP and the first electrode EL1 may be different from the line resistance between the touch pad unit TP and the sensing column SC, because of the resistance R. Even though the touch electrode TCE and the temperature sensing electrode TME are electrically connected to the same second sensing line SL2, driving frequencies may be different for the touch electrode TCE and the temperature sensing electrode TME because of the line resistance difference.

Because the second sensor pattern SP2 of the touch electrode TCE and the first electrode EL1 of the temperature sensing electrode TME are connected to the same second sensing line SL2, the number of sensing lines SL positioned in the non-sensing area NSA may be reduced. Advantageously, the non-sensing area NSA may be minimized.

According to embodiments, a touch sensor may sense a temperature change in addition to a touch of a user.

Although examples of amendments have been described, the described embodiments may be changed without departing from the scope of the claims.

What is claimed is:

1. A touch sensor comprising:
   first sensor patterns electrically connected in a first direction;
   second sensor patterns electrically insulated from the first sensor patterns and electrically connected in a second direction different from the first direction;
   a conductive line electrically connected to at least one of the first sensor patterns or at least one of the second sensor patterns; and
   a temperature sensing electrode set positioned between two of the first sensor patterns, positioned between two of the second sensor patterns, or positioned between the conductive line and at least one of the first sensor patterns and the second sensor patterns,
   wherein the temperature sensing electrode set includes a first electrode and a second electrode spaced from each other, and
   wherein a distance between the first electrode and the second electrode is less than a distance between a first sensor pattern among the first sensor patterns and an immediately neighboring second sensor pattern among the second sensor patterns.

2. The touch sensor according to claim 1, further comprising:
   a first connection pattern extending in the second direction; and
   a second connection pattern extending in the second direction,
   wherein the second sensor patterns include a first sub-pattern and a second sub-pattern spaced from each other in the first direction and include a third sub-pattern and a fourth sub-pattern spaced from each other in the first direction,
   wherein the first sub-pattern is electrically connected to the third sub-pattern through the first connection pattern, and
   wherein the second sub-pattern is electrically connected to the fourth sub-pattern through the second connection pattern.

3. The touch sensor according to claim 2, wherein the temperature sensing electrode set is positioned between the first sub-pattern and the second sub-pattern.

4. The touch sensor according to claim 3,
   wherein the second electrode is positioned between the first sub-pattern and the first electrode,
   wherein the temperature sensing electrode set further includes a third electrode positioned between the first electrode and the second sub-pattern, and
   wherein each of the first electrode, the second electrode, and the third electrode extends in the second direction between the first sub-pattern and the second sub-pattern.

5. The touch sensor according to claim 1, further comprising:
   a first connection pattern extending in the first direction; and
   a second connection pattern extending in the first direction,
   wherein the first sensor patterns include a first sub-pattern and a second sub-pattern spaced from each other in the second direction and include a third sub-pattern and a fourth sub-pattern spaced from each other in the second direction,
   wherein the first sub-pattern is electrically connected to the third sub-pattern through the first connection pattern,
   wherein the second sub-pattern is electrically connected to the fourth sub-pattern through the second connection pattern.

6. The touch sensor according to claim 5, wherein the temperature sensing electrode set is positioned between the first sub-pattern and the second sub-pattern.

7. The touch sensor according to claim 6,
   wherein the second electrode is positioned between the first sub-pattern and the first electrode,
   wherein the temperature sensing electrode set further includes a third electrode positioned between the first electrode and the second sub-pattern, and
   wherein each of the first electrode, the second electrode, and the third electrode extends in the first direction between the first sub-pattern and the second sub-pattern.

8. The touch sensor according to claim 1,
   wherein the conductive line extends in the second direction, and
   wherein the temperature sensing electrode set is disposed between the conductive line and the second sensor patterns.

9. The touch sensor according to claim 8, comprising:
   a touch pad;
   first sensing lines disposed electrically connecting the touch pad to the first sensor patterns;
   second sensing lines including the conductive line and electrically connecting the touch pad to the second sensor patterns; and
   a third sensing line electrically connecting the touch pad to the first electrode.

10. A touch sensor comprising:
    first sensor patterns electrically connected in a first direction;
    second sensor patterns electrically insulated from the first sensor patterns and electrically connected in a second direction different from the first direction;
    a conductive line electrically connected to at least one of the first sensor patterns or at least one of the second sensor patterns;

a temperature sensing electrode set positioned between two of the first sensor patterns, positioned between two of the second sensor patterns, or positioned between the conductive line and at least one of the first sensor patterns and the second sensor patterns; and a bridge pattern electrically connecting the two of the first sensor patterns, wherein the temperature sensing electrode set includes a first electrode and a second electrode spaced from each other, and wherein the second electrode and the third electrode are electrically connected to the two of the first sensor patterns through the bridge pattern.

11. The touch sensor according to claim 10, further comprising:
a base layer;
a first insulating layer overlapping the base layer and positioned between the first electrode and the bridge pattern; and
a second insulating layer overlapping the first insulating layer, wherein at least one of the first electrode and the bridge pattern is positioned between the first insulating layer and the second insulating layer.

12. The touch sensor according to claim 11, wherein the first sensor patterns, the second sensor patterns, the first connection pattern, the second connection pattern, the first electrode, and the second electrode are positioned between the base layer and the first insulating layer.

13. The touch sensor according to claim 11, wherein the first sensor patterns, the second sensor patterns, the first connection pattern, the second connection pattern, the first electrode, and the second electrode are positioned between the first insulating layer and the second insulating layer.

14. The touch sensor according to claim 10, wherein each of the first sensor patterns, each of the second sensor patterns, the first electrode, and the second electrode each have a mesh structure.

15. The touch sensor according to claim 10, comprising:
a touch pad;
first sensing lines electrically connecting the touch pad to the first sensor patterns;
second sensing lines electrically connecting the touch pad to the second sensor patterns; and
a third sensing line electrically connecting the touch pad to the first electrode,
wherein the conductive line is one of the first sensing lines or one of the second sensing lines.

16. The touch sensor according to claim 10, comprising:
a touch pad electrically connected through the conductive line to some of the second sensor patterns;
first sensing lines electrically connecting the touch pad to the first sensor patterns; and
a resistor electrically connected between the conductive line and the first electrode.

17. A touch sensor comprising:
first sensor patterns electrically connected in a first direction;
second sensor patterns electrically insulated from the first sensor patterns and electrically connected in a second direction different from the first direction;
a conductive line electrically connected to at least one of the first sensor patterns or at least one of the second sensor patterns;
a temperature sensing electrode set positioned between two of the first sensor patterns, positioned between two of the second sensor patterns, or positioned between the conductive line and at least one of the first sensor patterns and the second sensor patterns;
a first connection pattern extending in the first direction; and
a second connection pattern extending in the first direction,
wherein the temperature sensing electrode set includes a first electrode and a second electrode spaced from each other,
wherein the first sensor patterns include a first sub-pattern and a second sub-pattern spaced from each other in the second direction and include a third sub-pattern and a fourth sub-pattern spaced from each other in the second direction,
wherein the first sub-pattern is electrically connected to the third sub-pattern through the first connection pattern,
wherein the second sub-pattern is electrically connected to the fourth sub-pattern through the second connection pattern, and
wherein a distance between the first electrode and the second electrode is less than a distance between two immediately neighboring ones of the first sensor patterns and is less than a distance between two immediately neighboring ones of the second sensor patterns.

18. A touch sensor comprising:
first sensor patterns electrically connected in a first direction;
second sensor patterns electrically insulated from the first sensor patterns and electrically connected in a second direction different from the first direction;
a conductive line electrically connected to at least one of the first sensor patterns or at least one of the second sensor patterns;
a temperature sensing electrode set positioned between two of the first sensor patterns, positioned between two of the second sensor patterns, or positioned between the conductive line and at least one of the first sensor patterns and the second sensor patterns;
a touch pad electrically connected through the conductive line to some of the second sensor patterns; and
a resistor electrically connected between the conductive line and the first electrode,
wherein the temperature sensing electrode set includes a first electrode and a second electrode spaced from each other,
wherein the conductive line extends in the second direction, and
wherein the temperature sensing electrode set is disposed between the conductive line and the second sensor patterns.

19. A display device comprising:
a display panel for displaying an image;
the touch sensor disposed on the display panel;
a polarizing film disposed on the touch sensor and coupled to the touch sensor through a first adhesive layer; and
a window disposed on the polarizing film and coupled to the polarizing film through a second adhesive layer,
wherein the touch sensor comprises:
first sensor patterns electrically connected in a first direction;
second sensor patterns electrically insulated from the first sensor patterns and electrically connected in a second direction different from the first direction;

a conductive line electrically connected to at least one of the first sensor patterns or at least one of the second sensor patterns; and a temperature sensing electrode set positioned between two of the first sensor patterns, positioned between two of the second sensor patterns, or positioned between the conductive line and at least one of the first sensor patterns and the second sensor patterns, wherein the temperature sensing electrode set includes a first electrode and a second electrode spaced from each other, and wherein a distance between the first electrode and the second electrode is less than a distance between a first sensor pattern among the first sensor patterns and an immediately neighboring second sensor pattern among the second sensor patterns.

\* \* \* \* \*